United States Patent
Tamaso

(10) Patent No.: US 12,100,739 B2
(45) Date of Patent: *Sep. 24, 2024

(54) METHOD FOR PRODUCING SILICON CARBIDE SEMICONDUCTOR DEVICE AND SILICON CARBIDE SEMICONDUCTOR DEVICE

(71) Applicant: SUMITOMO ELECTRIC INDUSTRIES, LTD., Osaka (JP)

(72) Inventor: Hideto Tamaso, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 384 days.

This patent is subject to a terminal disclaimer.

(21) Appl. No.: 17/595,007

(22) PCT Filed: Jul. 14, 2020

(86) PCT No.: PCT/JP2020/027413
§ 371 (c)(1),
(2) Date: Nov. 5, 2021

(87) PCT Pub. No.: WO2021/010405
PCT Pub. Date: Jan. 21, 2021

(65) Prior Publication Data
US 2022/0208971 A1     Jun. 30, 2022

(30) Foreign Application Priority Data
Jul. 17, 2019   (JP) .................................. 2019-131803

(51) Int. Cl.
*H01L 29/16*   (2006.01)
*H01L 21/02*   (2006.01)
(Continued)

(52) U.S. Cl.
CPC .... *H01L 29/1608* (2013.01); *H01L 21/02378* (2013.01); *H01L 21/31116* (2013.01); *H01L 29/401* (2013.01); *H01L 29/45* (2013.01)

(58) Field of Classification Search
CPC ........... H01L 21/02378; H01L 21/0485; H01L 21/31116; H01L 21/32134; H01L 29/1608;
(Continued)

(56) References Cited

U.S. PATENT DOCUMENTS 8,823,017 B2   9/2014   Tamaso
9,893,162 B2   2/2018   Ohse et al.
(Continued)

FOREIGN PATENT DOCUMENTS

JP   2001-185507   7/2001
JP   2003-158259   5/2003
(Continued)

OTHER PUBLICATIONS

Office Action mailed on Feb. 26, 2024 with respect to the related U.S. Appl. No. 17/595,405.

*Primary Examiner* — Fazli Erdem
(74) *Attorney, Agent, or Firm* — IPUSA, PLLC

(57) ABSTRACT

A method for producing a silicon carbide semiconductor device includes preparing a silicon carbide substrate, forming an insulating film on one main surface of the silicon carbide substrate, forming a contact hole in the insulating film and exposing the one main surface of the silicon carbide substrate at a bottom surface of the contact hole, forming an Si film on the bottom surface of the contact hole, forming an Ni film on the Si film, performing a first heat treatment at a first temperature at which Ni and Si react, after the forming of the Ni film, removing an unreacted portion of the Ni film that does not react with the Si film by wet etching after the (Continued)

first heat treatment, and performing a second heat treatment at a second temperature higher than the first temperature after the removing of the unreacted portion.

11 Claims, 23 Drawing Sheets

(51) Int. Cl.
*H01L 21/311* (2006.01)
*H01L 29/40* (2006.01)
*H01L 29/45* (2006.01)

(58) Field of Classification Search
CPC .............. H01L 29/401; H01L 29/405; H01L 29/41741; H01L 29/66068; H01L 29/78; H01L 29/7802
USPC .......................................................... 257/77
See application file for complete search history.

(56) References Cited

U.S. PATENT DOCUMENTS

| | | |
|---|---|---|
| 2017/0271486 A1 | 9/2017 | Komatsu et al. |
| 2019/0115439 A1 | 4/2019 | Utsumi et al. |
| 2022/0231129 A1* | 7/2022 | Tamaso ............. H01L 29/41741 |

FOREIGN PATENT DOCUMENTS

| | | |
|---|---|---|
| JP | 2005-276978 | 10/2005 |
| JP | 2010-103229 | 5/2010 |
| JP | 2012-99598 | 5/2012 |
| JP | 2013-58587 | 3/2013 |
| JP | 2017-175115 | 9/2017 |
| JP | 2018-50008 | 3/2018 |
| JP | 2019-075472 | 5/2019 |

* cited by examiner

METHOD FOR PRODUCING SILICON CARBIDE SEMICONDUCTOR DEVICE AND SILICON CARBIDE SEMICONDUCTOR DEVICE

TECHNICAL FIELD

The present disclosure relates to a method for producing a silicon carbide semiconductor device and the silicon carbide semiconductor device.

This application is based upon and claims priority to Japanese Patent Application No. 2019-131803, filed Jul. 17, 2019, the entire contents of which are incorporated herein by reference.

BACKGROUND ART

In a process for producing a silicon carbide semiconductor device, there is a sub-process in which, when forming a drain electrode, and the like, a nickel (Ni) film is formed on the surface of a silicon carbide substrate, and a heat treatment is performed, so that silicon (Si) contained in the silicon carbide substrate and Ni are alloyed and an ohmic electrode is formed.

RELATED ART DOCUMENTS

Patent Documents

[Patent Document 1] Japanese Laid-Open Patent Application Publication No. 2005-276978
[Patent Document 2] Japanese Laid-Open Patent Application No. 2017-175115
[Patent Document 3] Japanese Laid-Open Patent Application No. 2012-99598

SUMMARY OF THE INVENTION

A method for producing a silicon carbide semiconductor device of the present disclosure includes a step of preparing a silicon carbide substrate, a step of forming an insulating film on one main surface of the silicon carbide substrate, a step of forming a contact hole in the insulating film, and exposing the one main surface of the silicon carbide substrates at a bottom surface of the contact hole, and a step of forming an Si film on the bottom surface of the contact hole. Further, a step of forming an Ni film on the Si film, a step of performing a first heat treatment at a first temperature at which Ni and Si react after the step of forming the Ni film, a step of removing an unreacted portion of the Ni film that does not react with the Si film, by wet etching after a first heat treatment, and a step of performing a second heat treatment at a second temperature higher than the first temperature after the step of removing the unreacted portion are included.

EMBODIMENT FOR CARRYING OUT THE INVENTION

Figure 1:
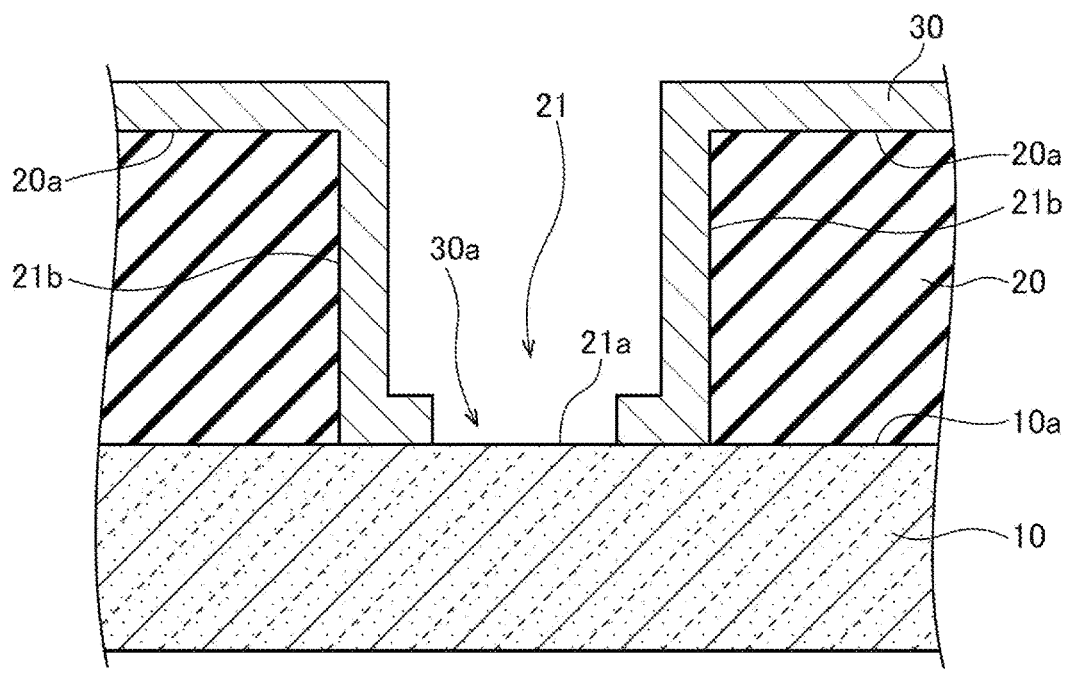
FIG. 1 is an explanatory diagram (1) of a method for producing a semiconductor device.

Problem to be Solved by the Present Disclosure

Because a silicon carbide substrate contains carbon (C) in addition to Si, Si contained in the silicon carbide may become alloyed with Ni, and thereby generate unreacted C, and the unreacted C may be deposited on the surface of the alloyed ohmic electrode. As described, if C is deposited on the surface of the ohmic electrode, degradation of the reliability may be caused when a metal wiring layer is formed on the ohmic electrode.

Therefore, a method for producing a silicon carbide semiconductor device that can form an ohmic electrode without carbon being deposited on the surface of the ohmic electrode is desired.

Effect of the Present Disclosure

According to the present disclosure, when forming an ohmic electrode on a surface of a silicon carbide substrate, the occurrence of carbon deposition on the surface of the ohmic electrode can be suppressed.

Embodiments will be described below.

Description of Embodiments of the Present Disclosure

First, the embodiments of the present disclosure will be listed and described. In the following description, the same or corresponding elements are referenced by the same sign and the description is not repeated for them.

[1] A method for producing a semiconductor device according to one aspect of the present disclosure includes a step of preparing a silicon carbide substrate, a step of forming an insulating film on one main surface of the silicon carbide substrate, a step of forming a contact hole in the insulating film and exposing the one main surface of the silicon carbide substrate at a bottom surface of the contact hole, a step of forming an Si film on the bottom surface of the contact hole, a step of forming an Ni film on the Si film, a step of performing a first heat treatment at a first temperature at which Ni and Si react, after the step of forming the Ni film, a step of removing an unreacted portion of the Ni film that does not react with the Si film, by wet etching after the first heat treatment, and a step of performing a second heat treatment at a second temperature higher than the first temperature after the step of removing the unreacted portion.

This can form an ohmic electrode on the surface of the silicon carbide substrate without carbon being deposited at the surface of the ohmic electrode.

[2] The step of forming the Si film on the bottom surface of the contact hole includes a step of forming a first Si film on the bottom surface and side surfaces of the contact hole and on the upper surface of the insulating film, and a step of removing at least the first Si film on the upper surface of the insulating film by dry etching after the step of forming the first Si film.

This determines a region where a reaction precursor of nickel silicide is formed. With Ni, it is generally difficult to perform dry etching and a microfabrication process cannot be performed by dry etching. However, by performing dry etching on the first Si film, the reaction precursor of nickel silicide can be formed with the microfabrication accuracy substantially the same as the dry etching accuracy.

[3] The first temperature is 200° C. or greater and 400° C. or less.

This allows a reaction precursor layer of nickel silicide to be formed.

[4] The second temperature is 800° C. or greater and 1100° C. or less.

This allows the reaction precursor layer to form an ohmic electrode on a portion that is in contact with the main surface of the silicon carbide substrate.

[5] The film thickness of the Si film at the bottom surface of the contact hole is 5 nm or greater and 100 nm or less.

If the Si film is thinner than 5 nm, even if a local variation in the surface is several nm, the influence of the local variation cannot be ignored, and it becomes difficult to control the process. Additionally, if the film thickness is greater than 100 nm, the amount is too large to react with the Ni film, and a non-uniform reaction precursor is formed.

[6] The film thickness of the Ni film at the bottom surface of the contact hole is 5 nm or greater and 100 nm or less.

If the Ni film is thinner than 5 nm, even if a local variation in the surface is several nm, the influence of the local variation cannot be ignored, and it becomes difficult to control the process. Additionally, if the film thickness is greater than 100 nm, the amount is too large to react with the Si film, and a non-uniform reaction precursor is formed.

[7] The Si film is also formed on the side surfaces of the contact hole.

Because dry etching typically has a fast etch rate in the vertical direction and a slow etch rate in the horizontal direction, the Si film may remain on the side surfaces, even if the Si film is caused to remain only on the bottom surface of the contact hole. Of course, the Si film on the side surfaces can be removed by devising improvements to the process.

[8] At the bottom surface of the contact hole in a state in which the Ni film is formed on the Si film, a relationship of $N_{Ni} \geq N_{Si}/2$ is established, when the number of Si atoms contained in the Si film per unit area accumulated in the thickness direction is $N_{Si}$, and the number of Ni atoms contained in the Ni film per unit area accumulated in the thickness direction is $N_{Ni}$.

When the ohmic electrode is formed when silicon carbide is reacted with nickel alone, $Ni_2Si$ is formed as the main component. In the present embodiment, the number of atoms is required to be adjusted to Ni:Si=2:1 in order to match the reaction precursor to this composition. Additionally, by increasing the amount of Ni from this composition, Ni becomes more reactive with silicon carbide. Conversely, when the amount of Ni is reduced from this composition, Ni tends to be insufficient and thus is less likely to react with silicon carbide.

[9] A silicon carbide substrate having a main surface, an insulating film provided on the main surface of the silicon carbide substrate, a contact hole provided on the insulating film, a first electrode that is provided on a portion of a bottom surface of the contact hole and that is in contact with the silicon carbide substrate, and second electrodes provided on side surfaces of the contact hole apart from the first electrode are included. The first electrode contains Si and Ni, and is in ohmic contact with the silicon carbide substrate.

The ohmic electrode can be formed on the bottom surface of the contact hole within a necessary minimum region without being formed in an unnecessary region. Particularly, etching damage is likely remain at the side surfaces of the contact hole, so that the second electrode can be used as a barrier film. Additionally, by separating the electrode on the bottom of the contact hole from the electrodes on the side surfaces of the contact hole, stress applied on the substrate and the insulating film can be reduced.

[10] At the bottom surface of the contact hole, the distance between the first electrode and the second electrode is 0.1 μm or greater and 1 μm or less.

If the distance is less than 0.1 μm, due to a problem of machining accuracy, locally unseparated spots start to appear. Additionally, if the distance is 1 μm or less, a margin for general processing accuracy variations can be used. This is because if the distance exceeds 1 μm, the resistance of the device increases.

Details of Embodiments of the Present Disclosure

Although one embodiment of the present disclosure will be described in detail below, the embodiment is not to be limited to the details described below.

First Embodiment

First, in a method for producing a silicon carbide semiconductor device, a process of forming an ohmic electrode on a surface of a silicon carbide substrate will be described. When forming the ohmic electrode on the surface of the silicon carbide substrate, after an Ni film is formed on the surface of the silicon carbide substrate by sputtering, an unnecessary Ni film is removed by wet etching or the like. Thereafter, by heating, Si contained in the silicon carbide substrate and Ni are alloyed to form a nickel silicide film being an ohmic electrode. At this time, because Si on the surface of the silicon carbide substrate is taken away for alloying with Ni, unreacted C is deposited on the surface of the nickel silicide film. Then, when an Al film is formed and a wiring layer is formed by sputtering, if C is deposited on the surface of the nickel silicide film being an ohmic electrode, the Al film tends to peel away, and this in turn causes a deterioration in reliability.

Various methods are being studied as a countermeasure for this.

For example, a method of, after forming a film containing Ni and Si on the surface of the silicon carbide substrate, removing the film containing Ni and Si disposed in a region other than a desired region, and performing a heat treatment. In this method, Ni and Si in the film containing Ni and Si are alloyed to form an ohmic electrode. Thus, when forming the ohmic electrode, because almost no Si contained in the silicon carbide substrate is taken away, deposition of C can be prevented to a great extent.

However, because it is difficult to remove Ni by dry etching and it is difficult to remove Si by wet etching, it is difficult to remove the film containing Ni and Si by dry etching or wet etching. Additionally, a method of forming a film containing Ni and Si in a desired region includes a method of forming the film by lift-off. However, with lift-off, a stripped away film may become reattached and it is not preferable because this causes a deterioration in reliability.

Therefore, because it is difficult to remove the film containing Ni and Si in a region other than a desired region in the method of forming a film containing Ni and Si on the surface of the silicon carbide substrate and performing heat treatment, it is not easy to cause the film containing Ni and Si to remain in the desired region.

In addition to the above-described method, a method of forming an ohmic electrode without using a resist or the like can be considered.

Specifically, first, as illustrated in FIG. 1, an insulating film 20 that is an interlayer insulating film having a contact hole 21 is formed on a main surface 10a that is a surface of a silicon carbide substrate 10, and then a TiN film 30 covering the contact hole 21 and the insulating film 20 is formed. Then, an opening 30a is formed by removing the TiN film 30 from a bottom surface 21a of the contact hole 21 to expose the main surface 10a of the silicon carbide substrate 10. This causes the insulating film 20 on the side surface 21b of the contact hole 21 and an upper surface 20a of the insulating film 20 to be covered by the TiN film 30.

Figure 2:
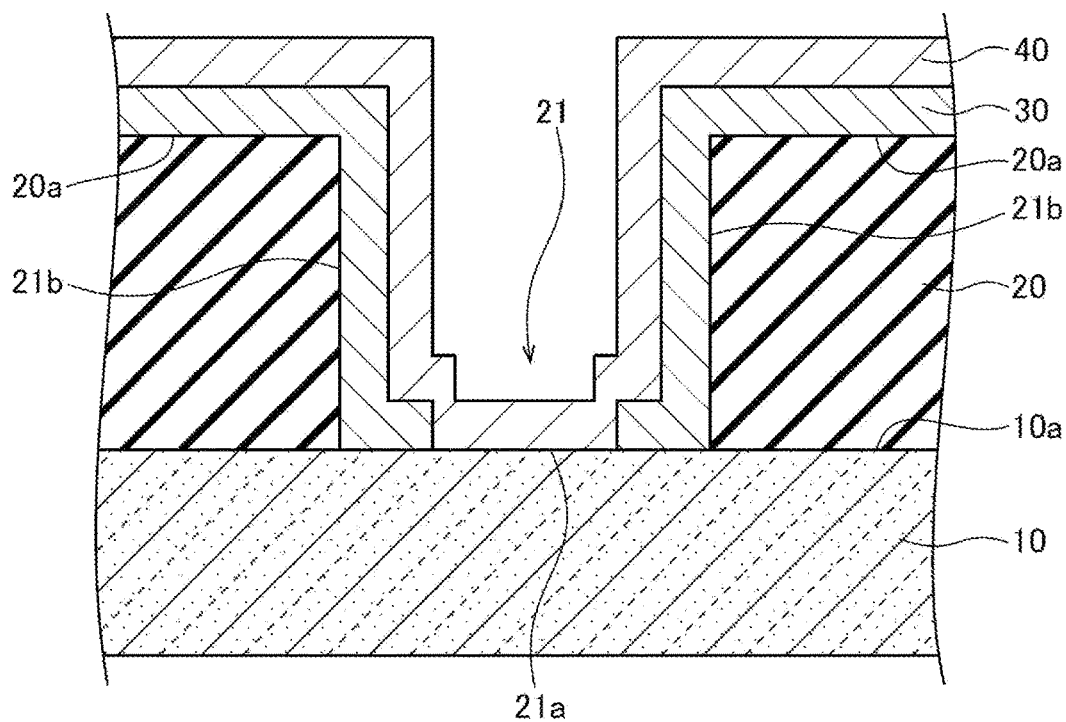
FIG. 2 is an explanatory diagram (2) of the method for producing the semiconductor device.

Next, as illustrated in FIG. 2, an Ni film 40 is formed by sputtering. This forms the Ni film 40 on the main surface 10a of the silicon carbide substrate 10 that is exposed at the bottom surface 21a of the contact hole 21, and on the TiN film 30.

Figure 3:
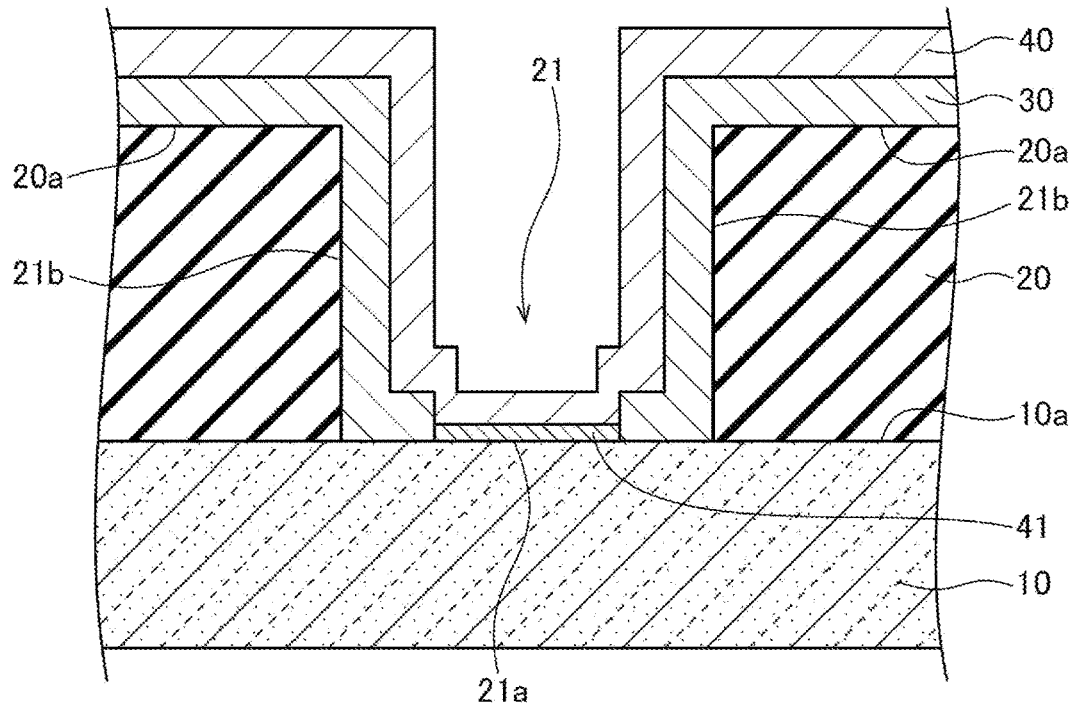
FIG. 3 is an explanatory diagram (3) of the method for producing the semiconductor device.

Next, as illustrated in FIG. 3, a reaction precursor layer 41 of nickel silicide in which Ni and Si are alloyed is formed at an interface between the silicon carbide substrate 10 and the Ni film 40 by performing a heat treatment at a temperature from 500° C. to 700° C. Here, a TiN film 30 is provided in order to prevent Ni from moving into the insulating film 20 during the heat treatment.

Figure 4:
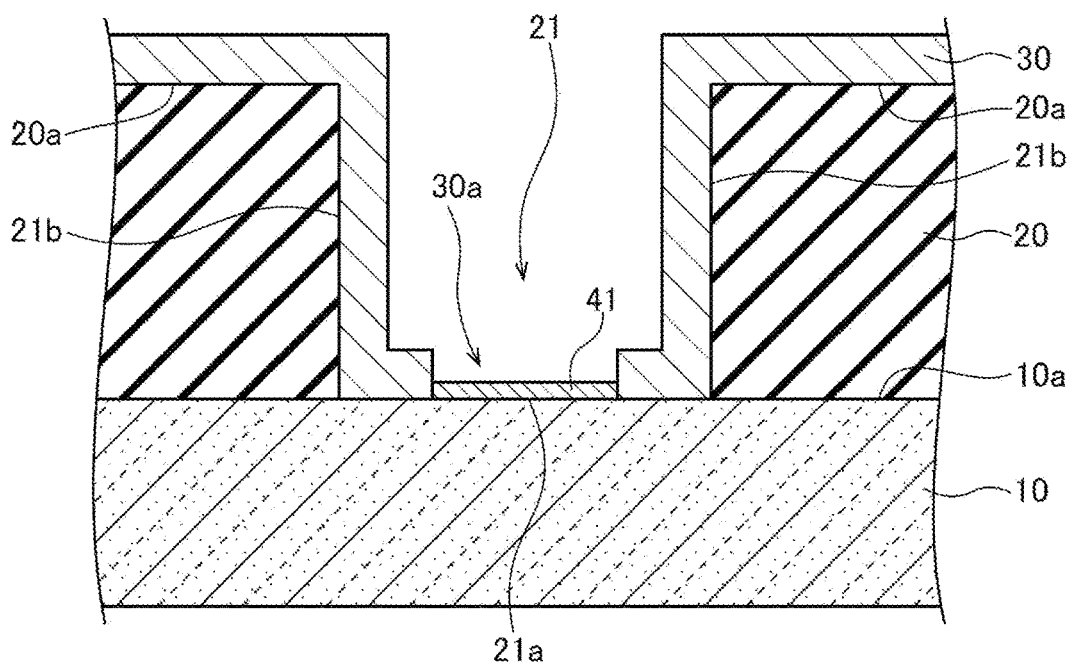
FIG. 4 is an explanatory diagram (4) of the method for producing the semiconductor device.

Next, as illustrated in FIG. 4, the Ni film 40 is removed by wet etching using dilute hydrochloric acid or dilute nitric acid. This causes the reaction precursor layer 41 to remain on the main surface 10a of the silicon carbide substrate 10 at the opening 30a of the TiN film 30.

Figure 5:
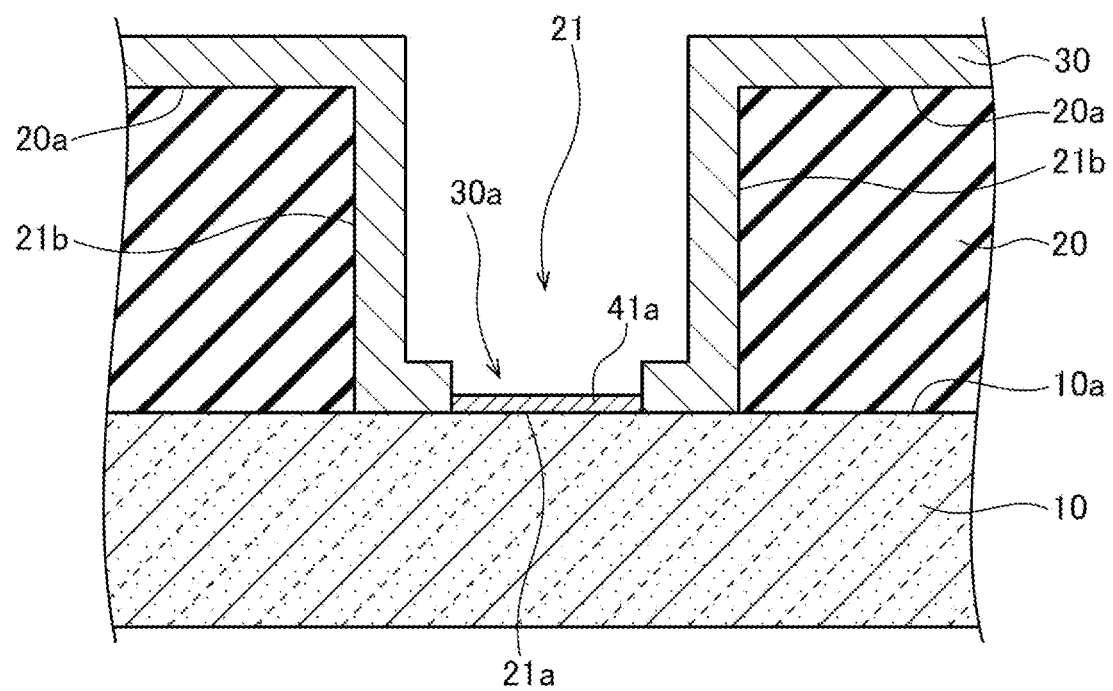
FIG. 5 is an explanatory diagram (5) of the method for producing the semiconductor device.

Next, as illustrated in FIG. 5, an ohmic electrode 41a is formed by performing a heat treatment on the reaction precursor layer 41 at a temperature of about 1000° C.

Because an ohmic electrode 41a formed in such a manner is several nm thick and extremely thin, the ohmic electrode 41a may be undesirably removed when a reverse sputtering used to form the wiring layer is performed in the subsequent process. Additionally, with this method, unreacted C is undesirably deposited on the surface of the ohmic electrode 41a.

(Method for Producing a Semiconductor Device)

Figure 6:
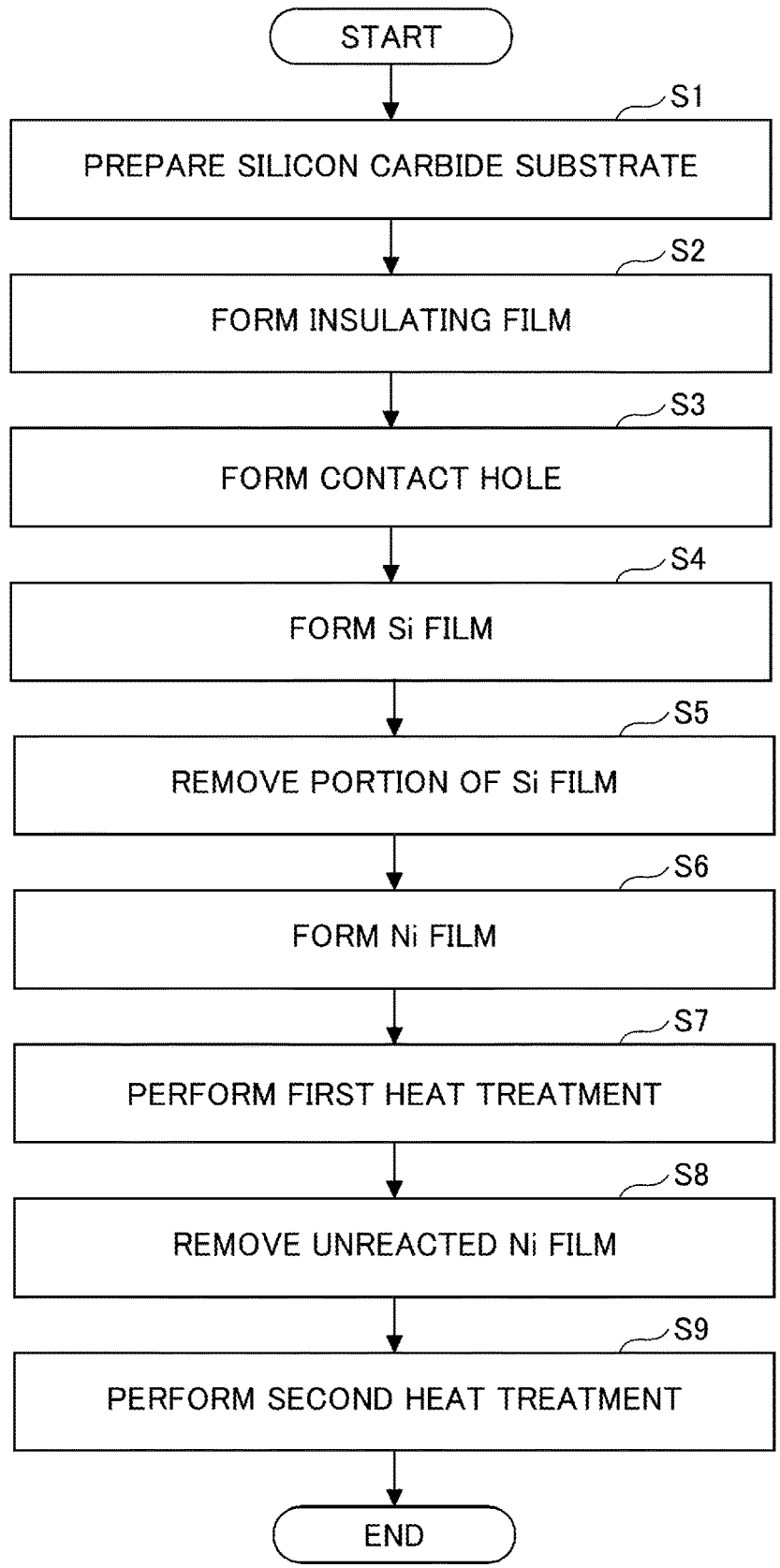
FIG. 6 is a flowchart of a method for producing a semiconductor device of a first embodiment of the present disclosure.

Next, a method for producing a semiconductor device according to a first embodiment will be described with reference to FIGS. 6 to 14. FIG. 6 is a flowchart of a method for producing the semiconductor device of the first embodiment of the present disclosure. FIGS. 7-14 are process diagrams of the method for producing the semiconductor device of the first embodiment of the present disclosure.

Figure 7:
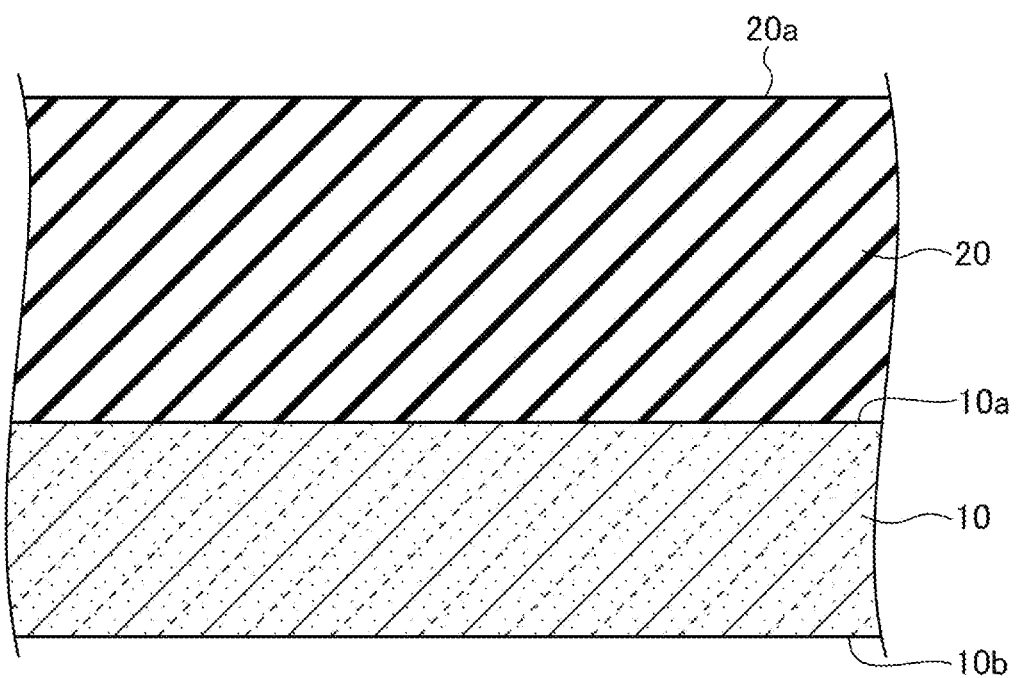
FIG. 7 is an explanatory diagram (1) of the method for producing the semiconductor device according to the first embodiment of the present disclosure.

First, as illustrated in FIG. 7, a silicon carbide substrate 10 having one main surface 10a and the other main surface 10b is prepared (step S1), and an insulating film 20 having a thickness of 0.8 μm is formed as an interlayer insulating film on the one main surface 10a of the silicon carbide substrate 10 by chemical vapor deposition (CVD) (step S2). The insulating film 20 is formed of silicon oxide.

Figure 8:
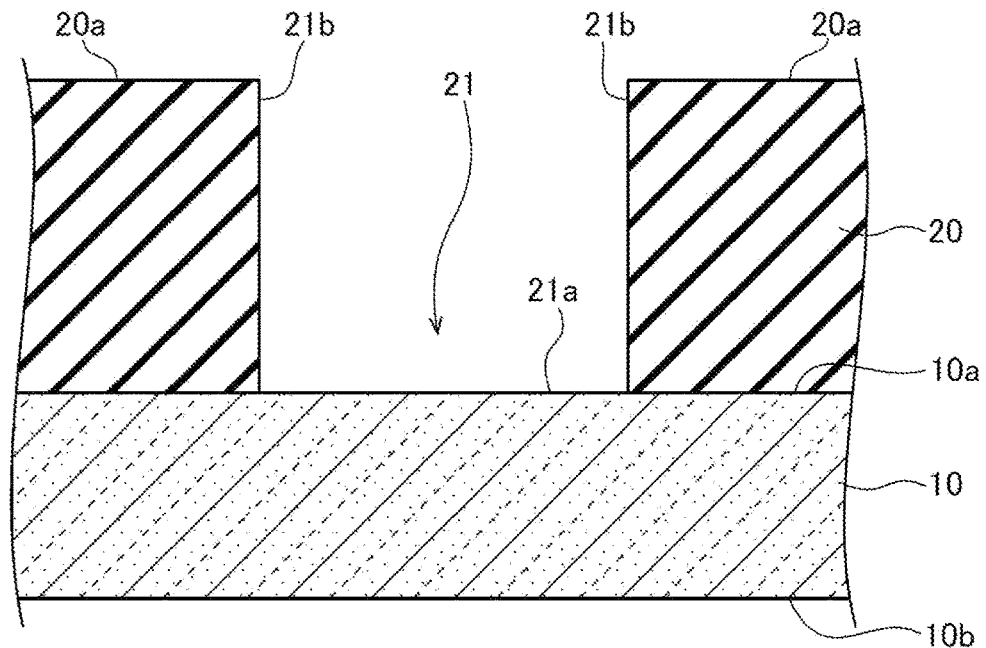
FIG. 8 is an explanatory diagram (2) of the method for producing the semiconductor device according to the first embodiment of the present disclosure.

Next, as illustrated in FIG. 8, a contact hole 21 is formed in the insulating film 20 (step S3). Specifically, a photoresist is applied to an upper surface 20a of the insulating film 20 and exposure and development are performed by an exposure device to form a resist pattern (which is not illustrated) with openings in a region where the contact hole 21 is formed. Thereafter, the insulating film 20 in the region where the resist pattern is not formed is removed by dry etching such as reactive ion etching (RIE) and the main surface 10a of the silicon carbide substrate 10 is exposed to form the contact hole 21. Thereafter, the resist pattern, which is not illustrated, is removed by an organic solvent or the like. With this process, the contact hole 21, in which the bottom surface 21a is the main surface 10a of the silicon carbide substrate 10 and the side surfaces 21b are the insulating film 20, is formed.

Figure 9:
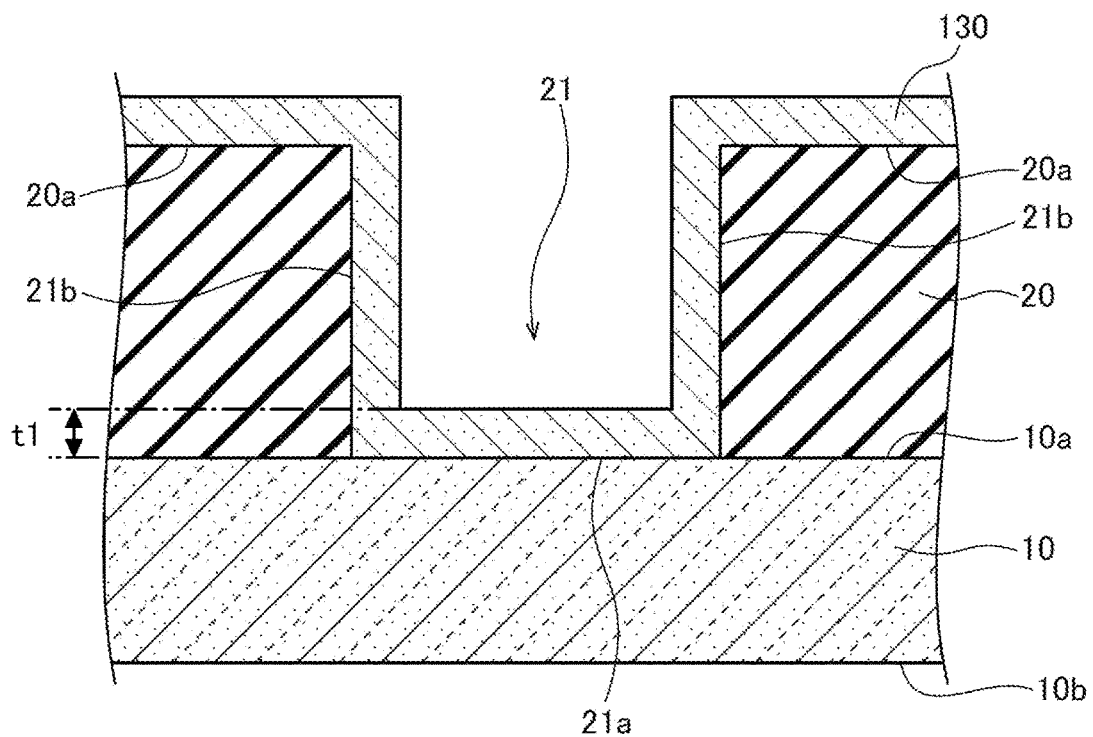
FIG. 9 is an explanatory diagram (3) of the method for producing the semiconductor device according to the first embodiment of the present disclosure.

Next, as illustrated in FIG. 9, an Si film 130 covering the bottom surface 21a and the side surfaces 21b of the contact hole 21 and the upper surface 20a of the insulating film 20 is formed by sputtering (step S4). A thickness t1 of the Si film 130 that is formed is 5 nm or greater and 100 nm or less. The thickness t1 of the Si film 130 is the thickness of the Si film 130 at the bottom surface 21a of the contact hole 21.

Figure 10:
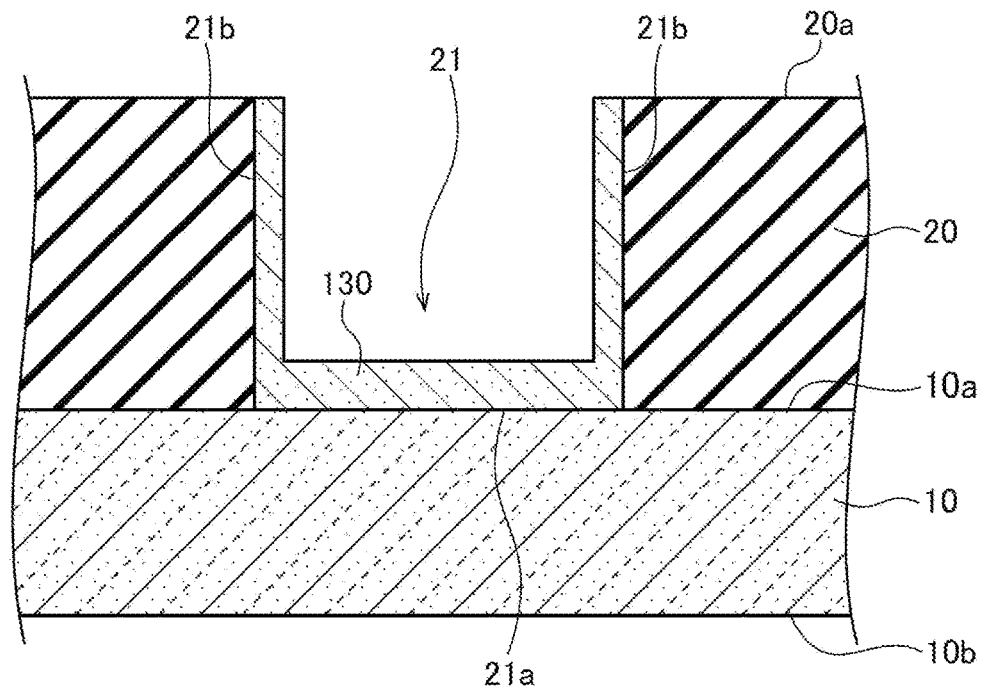
FIG. 10 is an explanatory diagram (4) of the method for producing the semiconductor device according to the first embodiment of the present disclosure.

Next, as illustrated in FIG. 10, the Si film 130 on the upper surface 20a of the insulating film 20 is removed (step S5). Specifically, a resist pattern, which is not illustrated, covering the bottom surface 21a of the contact hole 21 is formed and the Si film 130 in the region where the resist pattern is not formed is removed by dry etching, such as RIE. For the etching gas, a fluorine-based or chlorine-based etching gas is used. Then, the resist pattern is removed by an organic solvent or the like. This causes the Si film 130 covering the bottom surface 21a and the side surfaces 21b of the contact hole 21 to remain. The dry etching, such as RIE, is etching having anisotropy. Thus, even if the Si film 130 on the upper surface 20a of the insulating film 20 is completely removed from regions where the resist pattern is not formed, the Si film 130 covering the side surfaces 21b of the contact hole 21 cannot be completely removed and remains thin.

Figure 11:
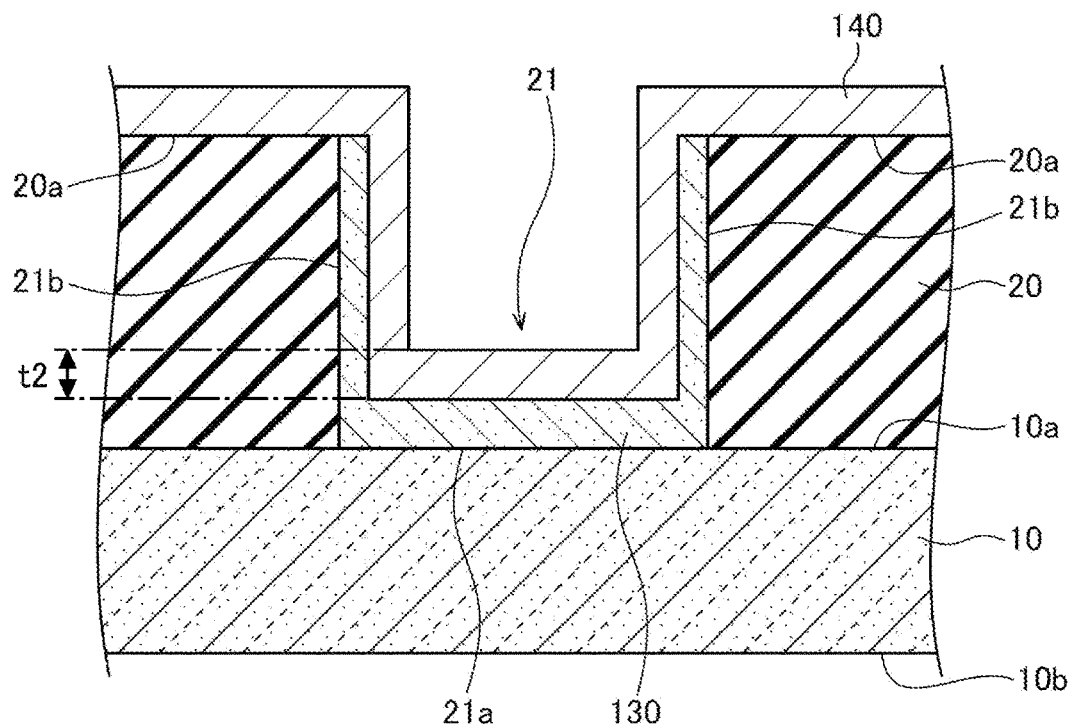
FIG. 11 is an explanatory diagram (5) of the method for producing the semiconductor device according to the first embodiment of the present disclosure.

Next, as illustrated in FIG. 11, an Ni film 140 is formed, by sputtering, on the Si film 130 at the bottom surface 21a and the side surfaces 21b of the contact hole 21 and on the upper surface 20a of the insulating film 20 (step S6). A thickness t2 of the Ni film 140 that is formed is 5 nm or greater and 100 nm or less. The thickness t2 of the Ni film 140 is the thickness of the Ni film 140 at the bottom surface 21a of the contact hole 21. The Si film 130 and the Ni film 140 are formed with a film thickness such that a relationship of $N_{Ni} \geq N_{Si}/2$ is established where, at the bottom surface 21a of the contact hole 21, the number of Si atoms contained in the Si film 130 per unit area accumulated in the thickness direction is $N_{Si}$, and the number of Ni atoms contained in the Ni film 140 per unit area accumulated in the thickness direction is $N_{Ni}$. Here, the thickness direction indicates a direction of the film thicknesses of the Si film 130 and the Ni film 140 and is perpendicular to film surfaces of the Si film 130 and the Ni film 140.

Figure 12:
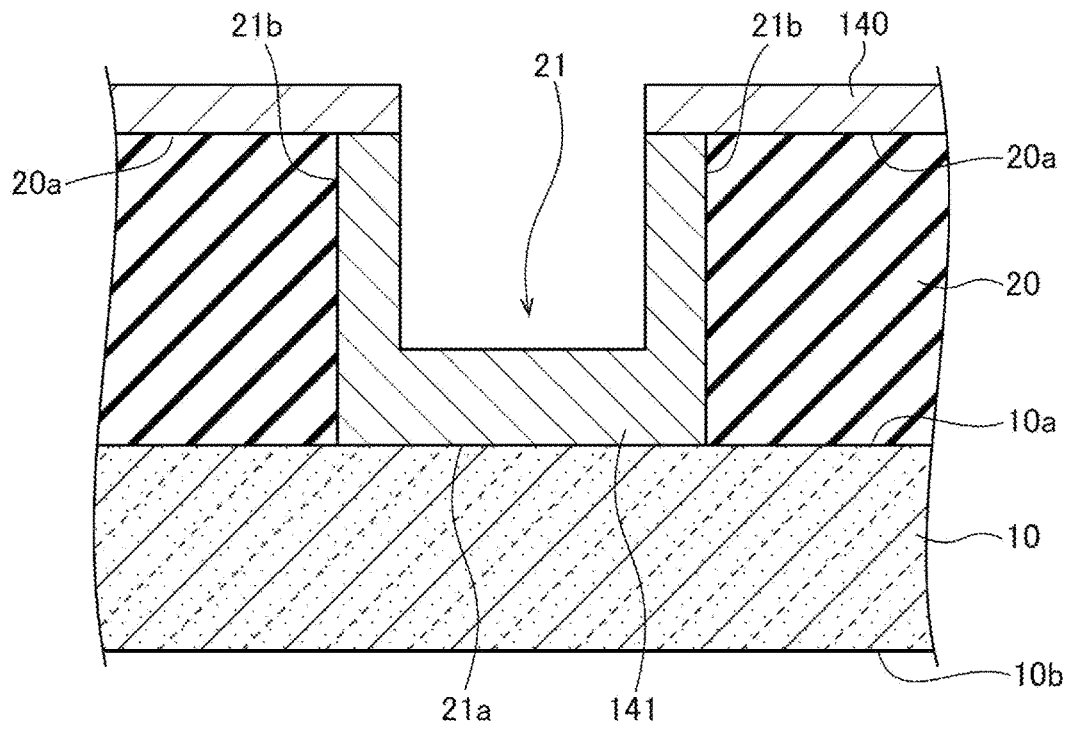
FIG. 12 is an explanatory diagram (6) of the method for producing the semiconductor device according to the first embodiment of the present disclosure.

Next, as illustrated in FIG. 12, a first heat treatment is performed at a temperature of 200° C. or greater and 400° C. or less, for example, about 350° C. (step S7). This causes Si of the Si film 130 and Ni of the Ni film 140 at the bottom surface 21a and the side surfaces 21b of the contact hole 21 to react to form a reaction precursor layer 141 of the nickel silicide. The temperature in the first heat treatment is a temperature at which Si and Ni react, but Si and Ni contained in SiC do not react. In the present application, this temperature may be referred to as a first temperature. The Ni film 140 is also formed on the upper surface 20a of the insulating film 20, but at a temperature of about 350° C., which is the temperature of the heat treatment in this process, Ni contained in the Ni film 140 does not move into the insulating film 20. The first temperature is the temperature of silicon carbide substrate 10. For example, the first heat treatment is performed using a furnace, and the temperature of the silicon carbide substrate 10 is substantially equal to the temperature in the furnace.

Figure 13:
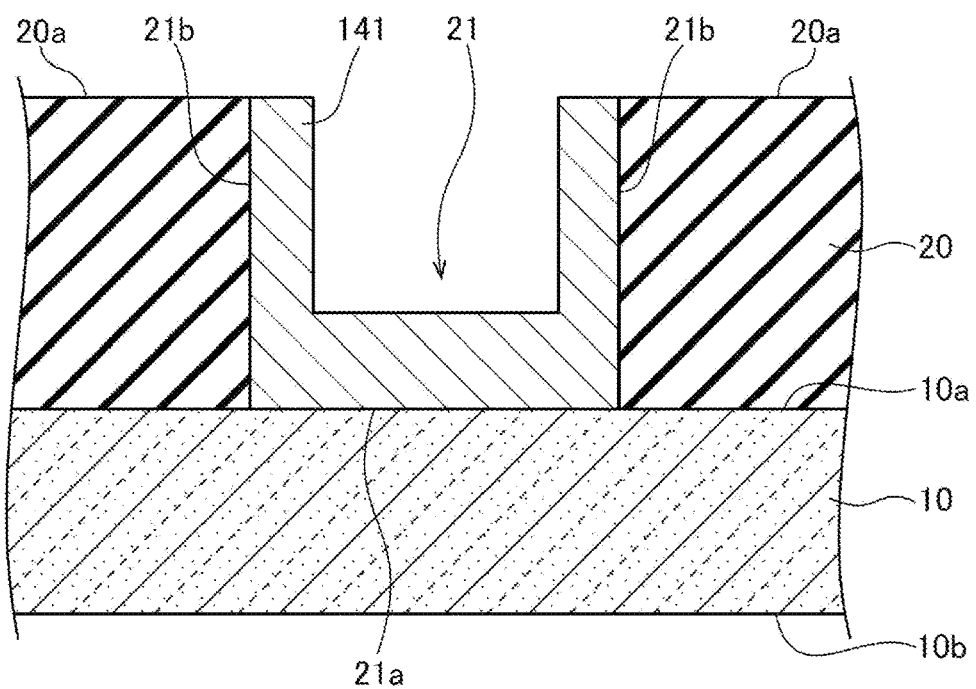
FIG. 13 is an explanatory diagram (7) of the method for producing the semiconductor device according to the first embodiment of the present disclosure.

Next, as illustrated in FIG. 13, the unreacted Ni film 140 on the upper surface 20a of the insulating film 20, i.e., a portion of the Ni film 140 that is not reacted with the Si film 130 is removed by wet etching (step S8). This causes the reaction precursor layer 141 to remain on the bottom surface 21a and the side surfaces 21b of the contact hole 21.

Figure 14:
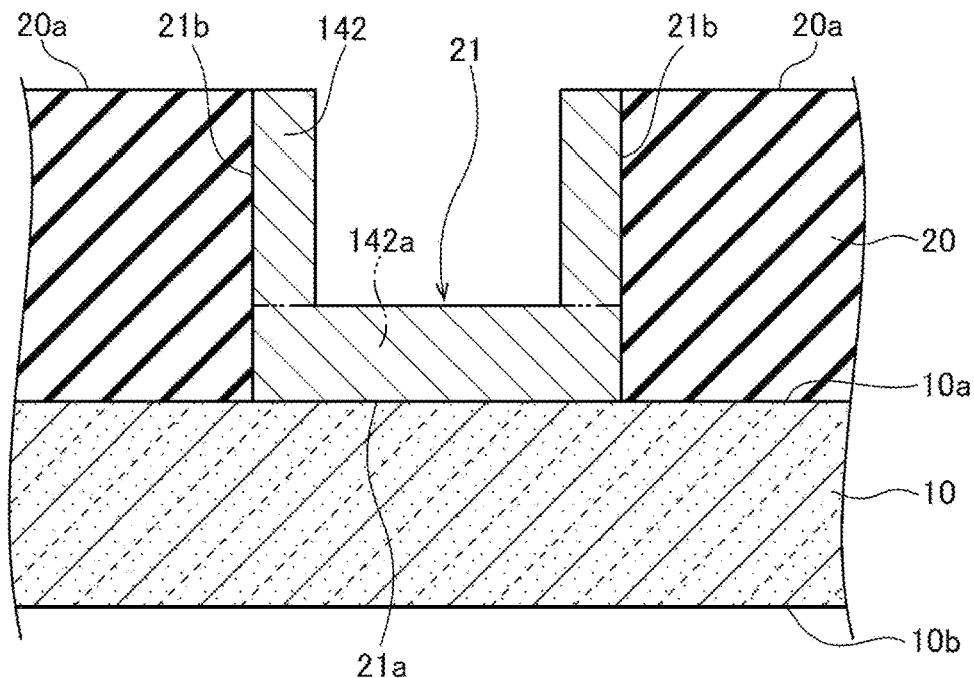
FIG. 14 is an explanatory diagram (8) of the method for producing the semiconductor device according to the first embodiment of the present disclosure.

Next, as illustrated in FIG. 14, a second heat treatment at a temperature of 800° C. or higher and 1100° C. or lower, for example, about 1000° C. is performed (step S9), so that an electrode layer 142 is formed by the reaction precursor layer 141. The electrode layer 142 includes an ohmic region 142a that is in ohmic contact with the main surface 10a of the silicon carbide substrate 10. The ohmic region 142a may function as an ohmic electrode. The temperature in this process is higher than the first temperature and is a temperature at which Si and Ni contained in SiC react. In the present application, the temperature of this heat treatment process may be referred to as a second temperature. The second temperature is the temperature of the silicon carbide substrate 10. For example, the second heat treatment is performed using a furnace, and the temperature of the silicon carbide substrate 10 is substantially equal to the temperature in the furnace.

In the electrode layer 142, Si contained in the silicon carbide substrate 10 moves into the ohmic region 142a.

In the present embodiment, the nickel silicide forming the ohmic region 142a of the electrode layer 142 is mostly formed of Si contained in the Si film 130 and Ni contained in the Ni film 140. Thus, in the second heat treatment, when forming the ohmic region 142a, unreacted Ni contained in the reaction precursor layer 141, of which the amount is small, reacts with Si supplied from the silicon carbide substrate 10. Thus, the amount of Si supplied from the silicon carbide substrate 10 is small. The amount of unreacted C that is generated is also small, so that almost no C is deposited on the surface of the electrode layer 142. Therefore, when a wiring layer, such as Al, is formed on the electrode layer 142, the wiring layer is not stripped from the surface of the electrode layer 142. Here, the wiring layer may be a film made by sequentially laminating TiN and Al.

In the present embodiment, because the formation of the TiN film illustrated in FIG. 1 is not required, the number of steps in the production process of producing the silicon carbide semiconductor device can be reduced and the cost can be reduced.

In the present embodiment, in the state illustrated in FIG. 11, the side surfaces 21b of the contact hole 21 are covered by the Si film 130, so that the silicon oxide forming the side surfaces 21b of the contact hole 21 is not in direct contact with the Ni film 140. Thus, even if the second heat treatment is performed at a temperature of about 1000° C., Ni does not move into the insulating film 20 and the insulating film 20 does not deteriorate. Here, if the Ni film is in direct contact with the insulating film formed of silicon oxide, Ni moves into the insulating film at the heating temperature of about 500° C., and this causes the insulating film to deteriorate.

Modified Example

Next, a modified example of the present embodiment will be described.

In the modified example, after the process illustrated in FIG. 9, the size of the remaining Si film 130 is changed by changing the size of the resist pattern, which is not illustrated, formed on the Si film 130.

Figure 15:
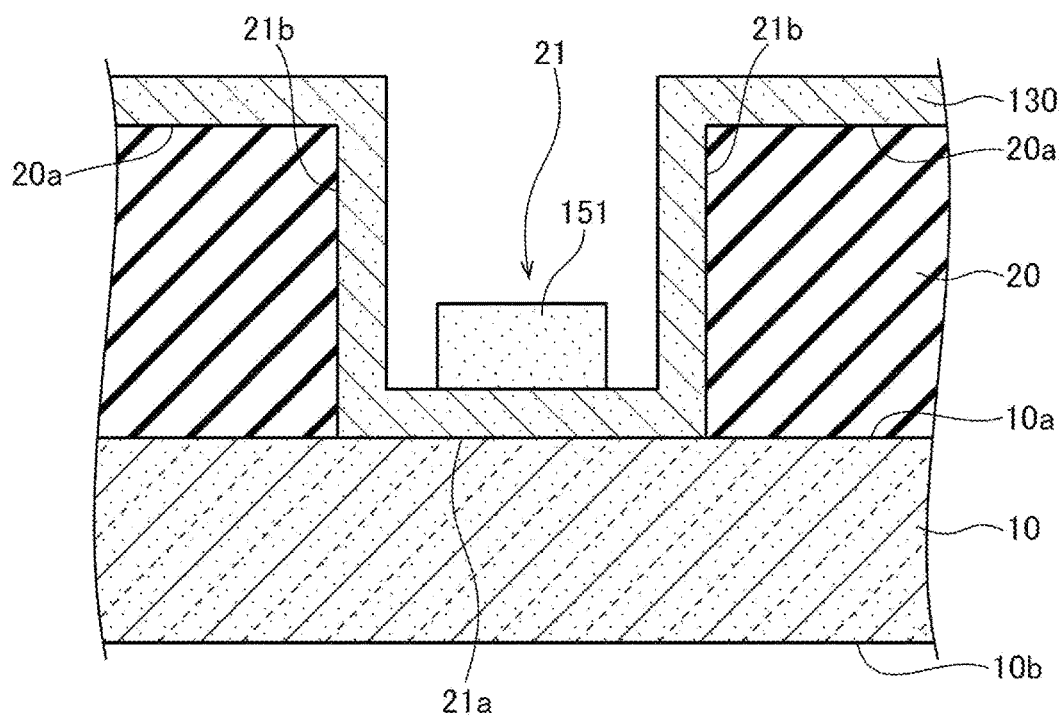
FIG. 15 is an explanatory diagram (1) of a method for producing a modified example 1 of the semiconductor device of the first embodiment of the present disclosure.
Figure 16:
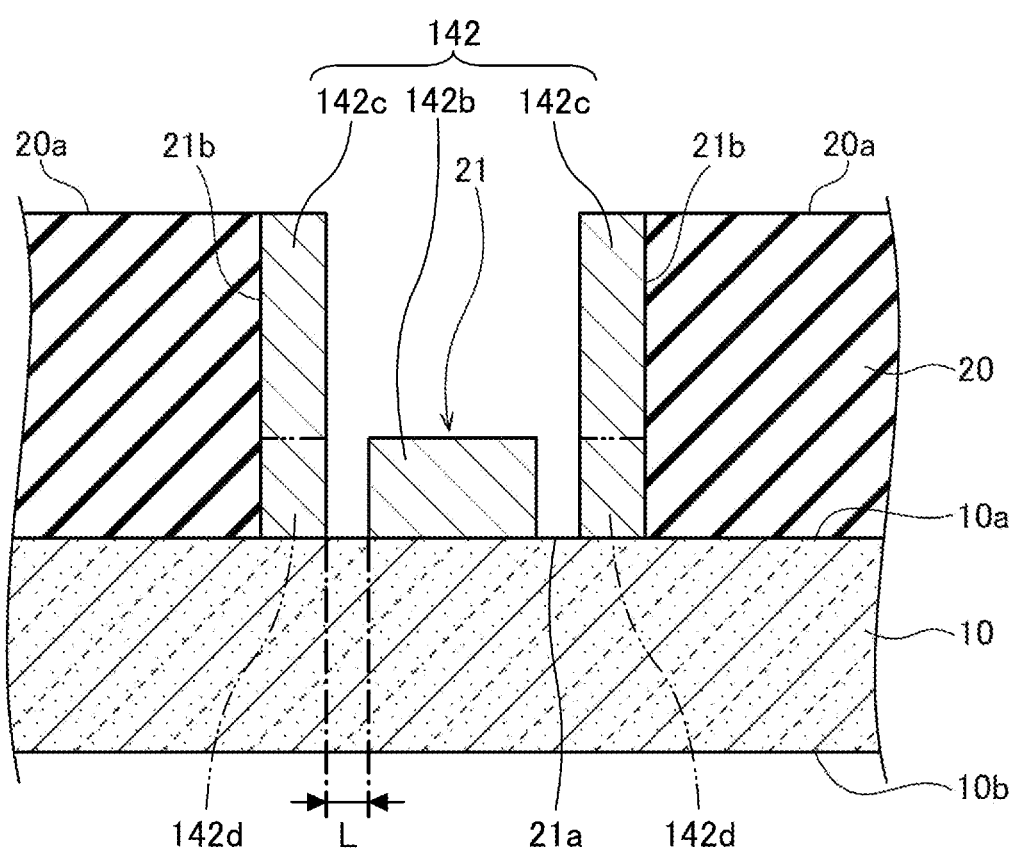
FIG. 16 is an explanatory diagram (2) of the method for producing the modified example 1 of the semiconductor device of the first embodiment of the present disclosure.

For example, after the process illustrated in FIG. 9 (step S4), as illustrated in FIG. 15, a resist pattern 151 is formed on the Si film 130 in a region narrower than the bottom surface 21a of the contact hole 21, and the Si film 130 in a region where the resist pattern 151 is not formed is removed. Thereafter, as illustrated in FIG. 16, a first electrode 142b in contact with the bottom surface 21a of the contact hole 21 and second electrodes 142c in contact with the side surfaces 21b of the contact hole 21 are formed apart from one another by performing substantially the same steps as described above (steps S5 to S9). That is, at the bottom surface 21a of the contact hole 21, the first electrode 142b and the second electrodes 142c are formed apart from one another. The distance L between the first electrode 142b and the second electrode 142c is preferably 0.1 µm or greater and 1 µm or less. Here, as illustrated in FIG. 16, there is no Ni film that is in contact with the insulating film 20, on the upper surface 20a of the insulating film 20.

Here, Si contained in the silicon carbide substrate 10 moves into the first electrode 142b, and the first electrode 142b can function as an ohmic electrode. The second electrode 142c includes an ohmic region 142d, into which Si contained in the silicon carbide substrate 10 moves, in the vicinity of the main surface 10a of the silicon carbide substrate 10, and the ohmic region 142d can function as an ohmic electrode. In the second electrode 142c, Si does not move into portions apart from the main surface 10a of the silicon carbide substrate 10 any further than the ohmic region 142d. Therefore, the second electrode 142c has a portion that contains less Si than the first electrode 142b, so the second electrode 142c has a portion that has a lower concentration of Si than the first electrode 142b.

When the first electrode 142b is formed, Si slightly moves from the silicon carbide substrate 10. Accordingly, unreacted C contained in the silicon carbide substrate 10 also moves into the first electrode 142b. With respect to the above, unreacted C may move into a portion of the second electrode 142c in the vicinity of the main surface 10a of the silicon carbide substrate 10, but unreacted C does not move into a portion of the second electrode 142c apart from the main surface 10a of the silicon carbide substrate 10. Therefore, in the second electrode 142c, there is a region where C is not contained, so that there is a region whose concentration is lower than the concentration of C of the first electrode 142b.

Figure 17:
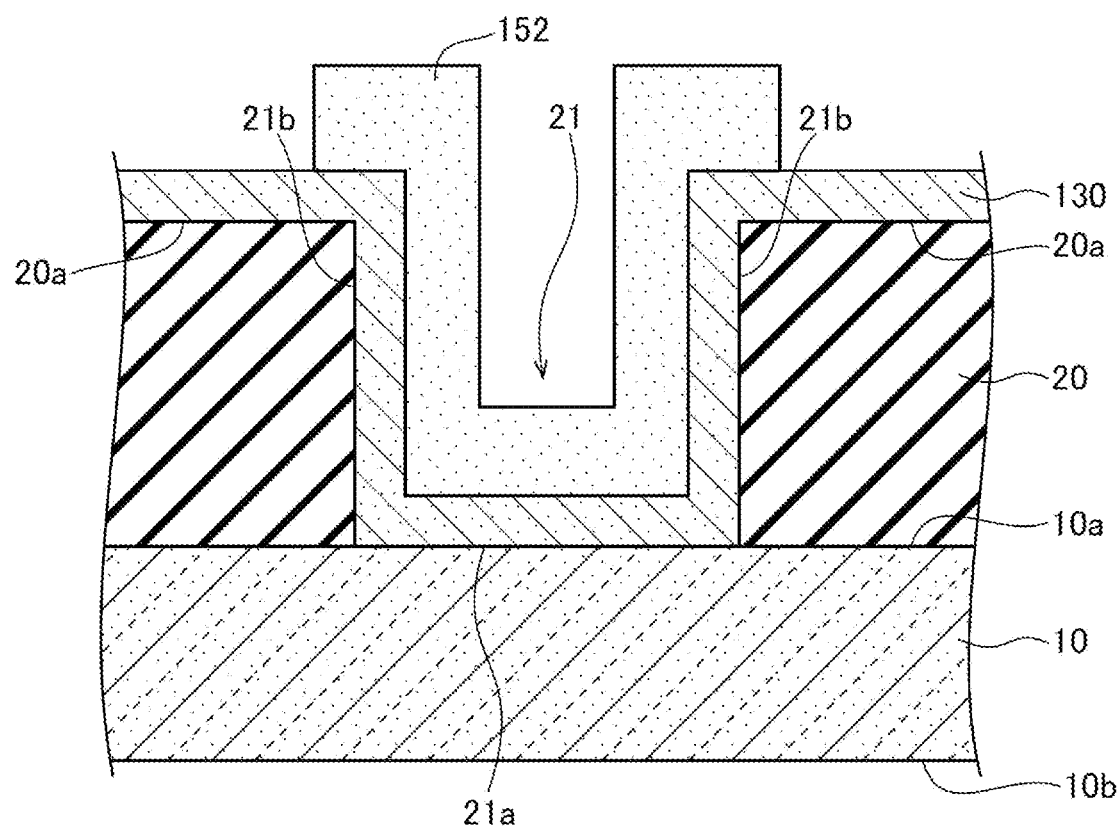
FIG. 17 is an explanatory diagram (1) of a method for producing a modified example 2 of the semiconductor device of the first embodiment of the present disclosure.
Figure 18:
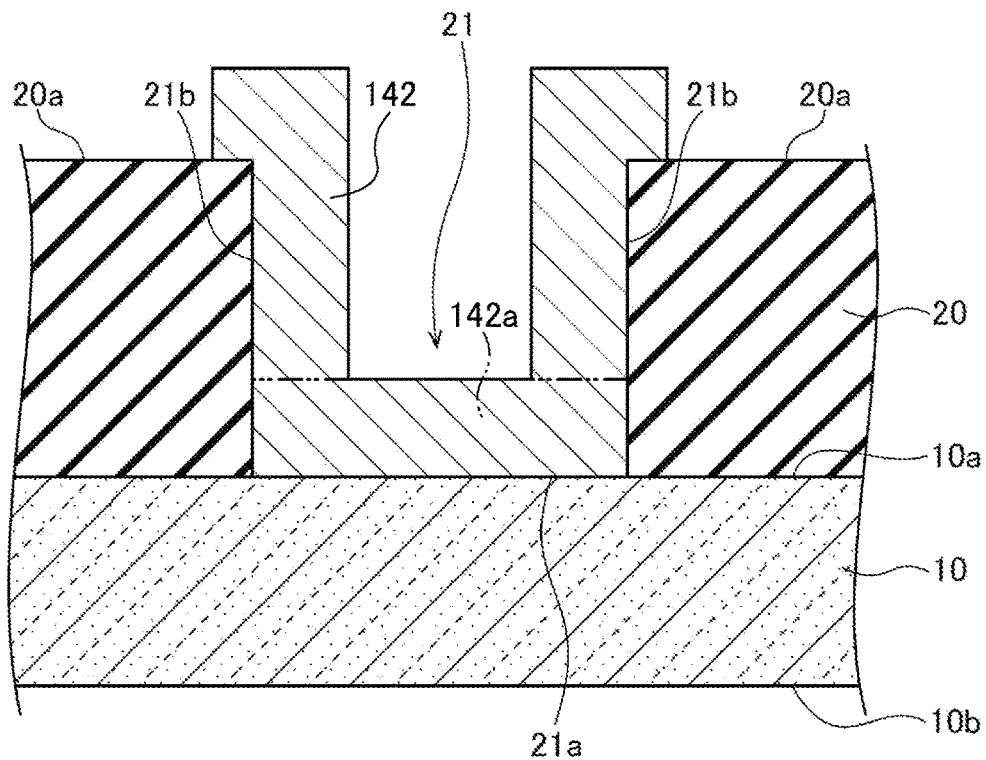
FIG. 18 is an explanatory diagram (2) of the method for producing the modified example 2 of the semiconductor device of the first embodiment of the present disclosure.

After the process illustrated in FIG. 9 (step S4), as illustrated in FIG. 17, a resist pattern 152 is formed on the Si film 130 in a region wider than the bottom surface 21a of the contact hole 21, and the Si film 130 in a region where the resist pattern 152 is not formed is removed. Subsequently, by performing substantially the same steps (steps S5 to S9) as described above, the electrode layer 142 is formed on the bottom surface 21a and side surfaces 21b of the contact hole 21 and the upper surface 20a of the insulating film 20 in the vicinity of the contact hole 21, as illustrated in FIG. 18.

Figure 19:
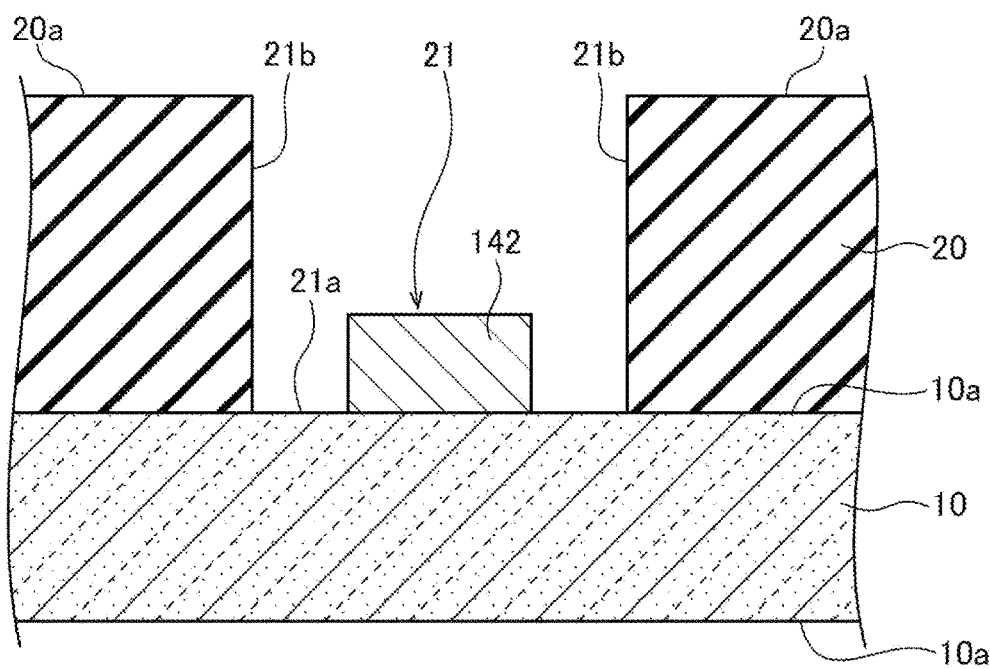
FIG. 19 is an explanatory diagram of a method for producing a modified example 3 of the semiconductor device of the first embodiment of the present disclosure.

As illustrated in FIG. 15, the resist pattern 151 may be formed on the Si film 130 in a region narrower than the bottom surface 21a of the contact hole 21, and the Si film 130 in the region where the resist pattern 151 is not formed may be removed by isotropic dry etching. In this case, because the Si film 130 is not formed on the side surfaces 21b, but is formed on the bottom surface 21a of the contact hole 21, the electrode layer 142, which is an ohmic electrode, is formed only on the bottom surface 21a of the contact hole 21, as illustrated in FIG. 19.

(Semiconductor Device)

Figure 20:
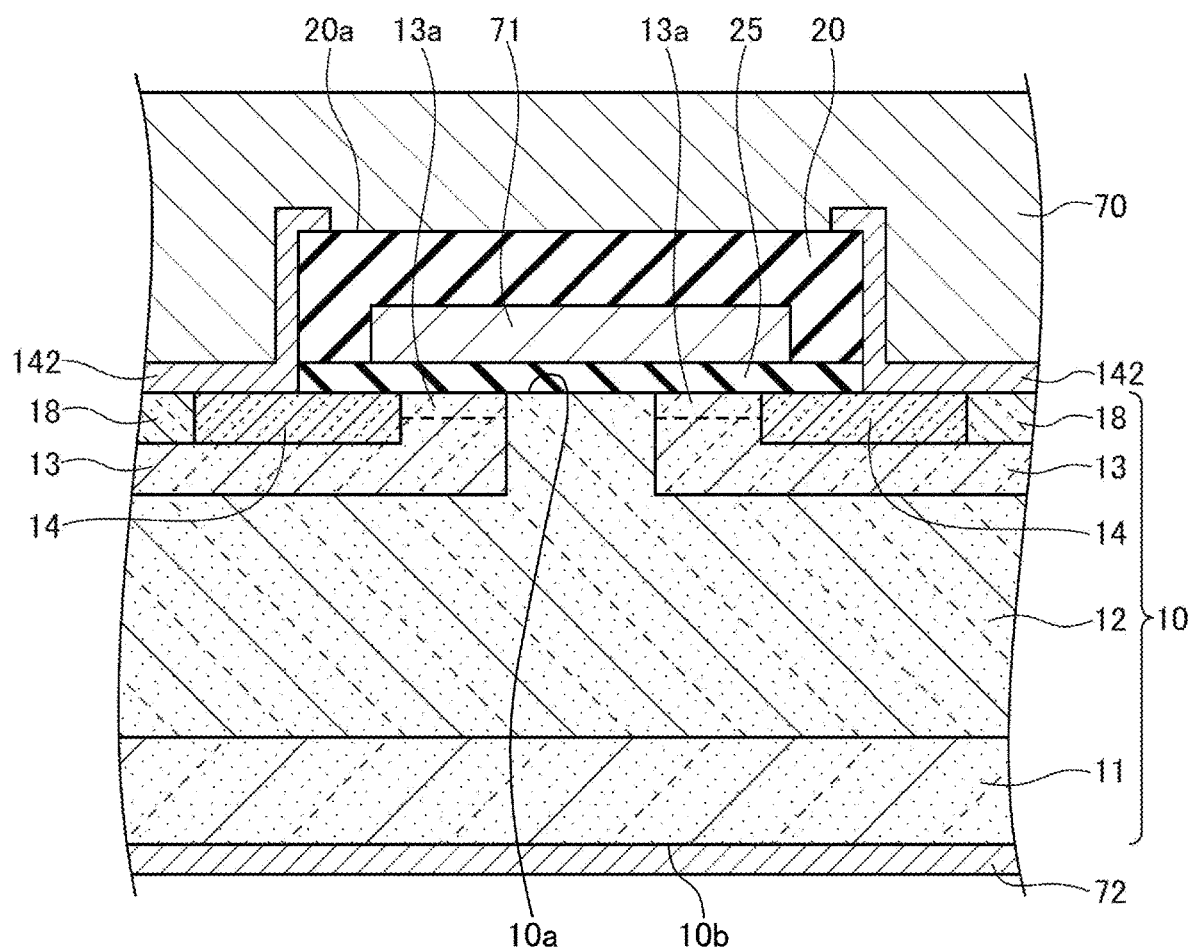
FIG. 20 is an explanatory diagram of the semiconductor device of the first embodiment of the present disclosure.

Next, an example of a semiconductor device according to the first embodiment will be described. The semiconductor device in the present embodiment is, for example, a vertical metal oxide semiconductor field effect transistor (MOSFET), as illustrated in FIG. 20. Specifically, the semiconductor device according to the present embodiment includes the silicon carbide substrate 10, the electrode layer 142, a wiring layer 70, a gate insulating film 25, and a gate electrode 71, and the gate electrode 71 is covered by the insulating film 20 that is an interlayer insulating film. The silicon carbide substrate 10 includes a first n-layer 11, a second n-layer 12, a p-body layer 13, an n-source region 14, and a p-region 18. The first n-layer 11 and the n-source region 14 are doped with more impurity elements than the second n-layer 12. The p-region 18 is doped with more impurity elements than the p-body layer 13.

The electrode layer 142 is produced by the producing method according to the present embodiment and is in ohmic contact with the n-source region 14 on one main surface 10a (the upper surface in the drawing) of the silicon carbide substrate 10. The thickness of the electrode layer 142 is about 100 to 200 nm thick, for example. The wiring layer 70 is formed on the electrode layer 142 and on the upper surface 20a of the insulating film 20.

The gate electrode 71 is provided on one main surface 10a (the upper surface in the drawing) of the silicon carbide substrate 10 through the gate insulating film 25 and faces a channel region 13a on the surface side of the p-body layer 13. Additionally, a drain electrode 72 is provided on the other main surface 10b (the lower surface in the drawing) of the silicon carbide substrate 10.

According to the present embodiment, a vertical MOSFET in which the wiring layer 70 tends not to peel away from the electrode layer 142 can be obtained.

Here, a p-collector layer may be formed on the side facing the drain electrode 72 of the silicon carbide substrate 10 to be a vertical insulated gate bipolar transistor (IGBT) instead of the vertical MOSFET. Additionally, a structure in which the gate electrode is embedded in a trench formed on the silicon carbide substrate through the gate insulation film (trench gate structure) may be used.

Second Embodiment

Next, a method for producing a semiconductor device according to a second embodiment will be described with reference to FIGS. 21 to 27.

Figure 21:
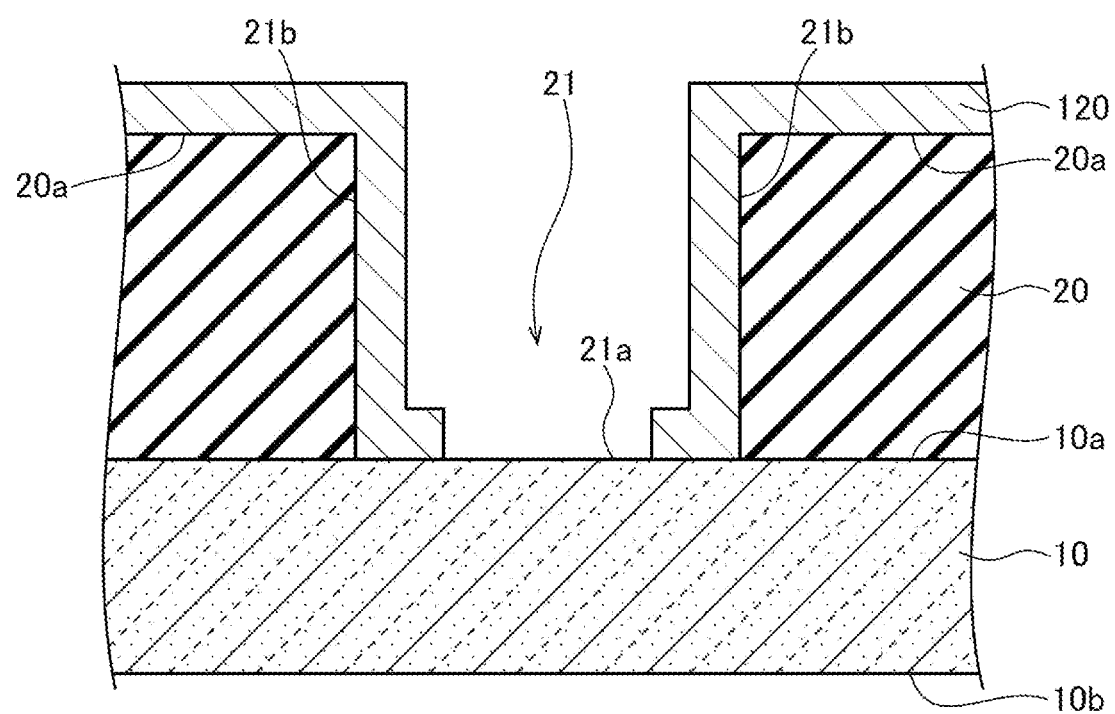
FIG. 21 is an explanatory diagram (1) of a method for producing a semiconductor device according to a second embodiment of the present disclosure.

First, as illustrated in FIG. 21, the insulating film 20 having the contact hole 21 is formed on the main surface 10a of the silicon carbide substrate 10, and then a TiN film 120 covering the contact hole 21 and the insulating film 20 is formed by sputtering. Subsequently, a portion of the TiN film 120 formed on the bottom surface 21a of the contact hole 21 is removed to expose the main surface 10a of the silicon carbide substrate 10. Here, the film thickness of the TiN film 120 that is formed is 10 nm or greater and 200 nm or less.

Figure 22:
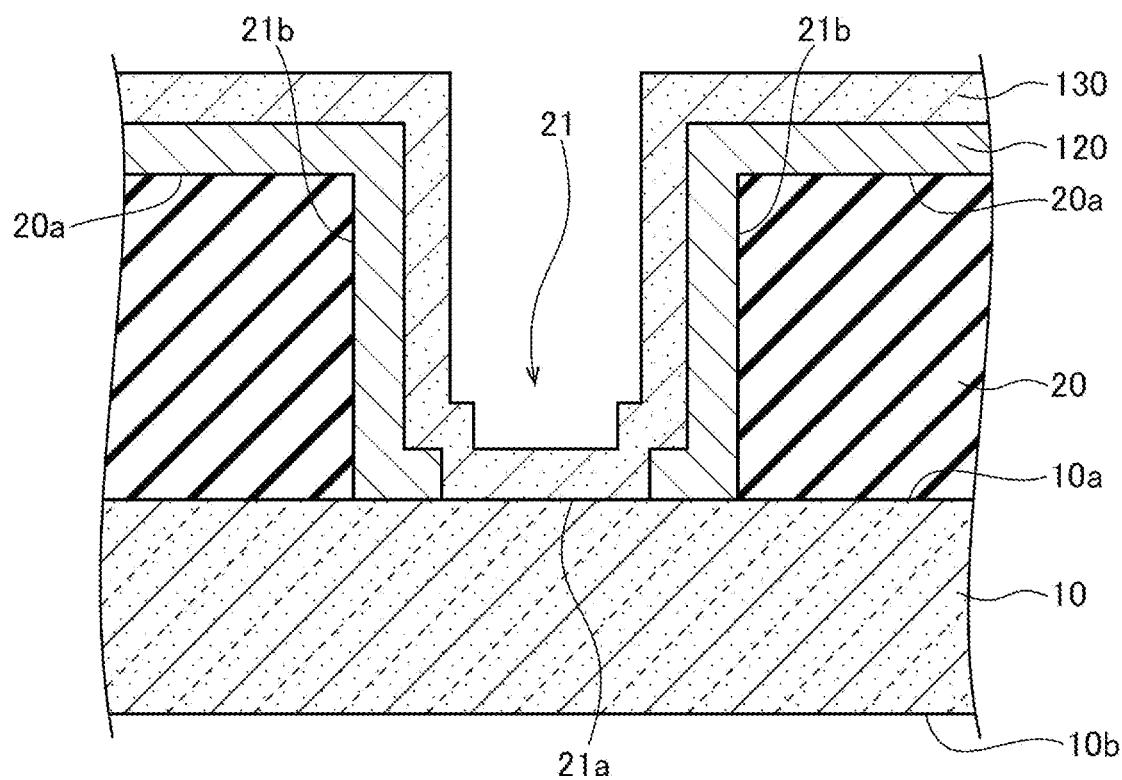
FIG. 22 is an explanatory diagram (2) of the method for producing the semiconductor device according to the second embodiment of the present disclosure.

Next, as illustrated in FIG. 22, the Si film 130 is formed by sputtering on the main surface 10a of the silicon carbide substrate 10 that is exposed, and on the TiN film 120.

Figure 23:
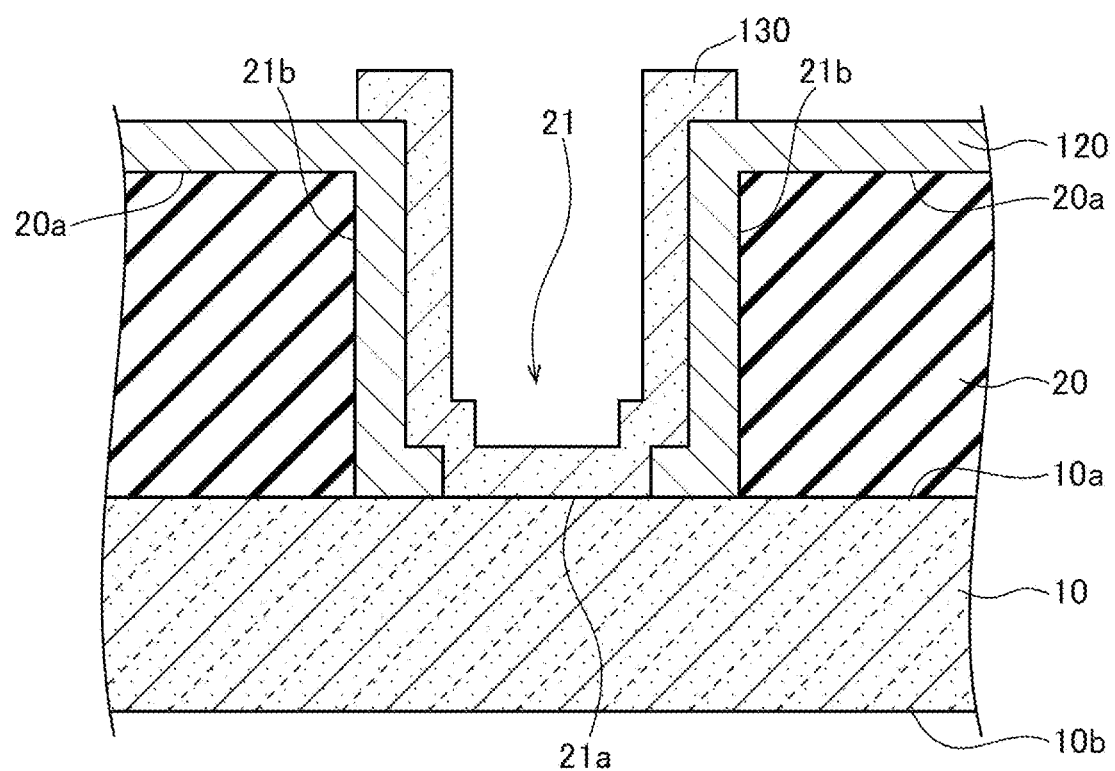
FIG. 23 is an explanatory diagram (3) of the method for producing the semiconductor device according to the second embodiment of the present disclosure.

Next, as illustrated in FIG. 23, the Si film 130 formed over the upper surface 20a of the insulating film 20 through the TiN film 120 is removed. At this time, in the vicinity of the contact hole 21, a portion of the Si film 130 may remain over the upper surface 20a of the insulating film 20 through the TiN film 120. This causes the Si film 130 covering the bottom surface 21a and side surfaces 21b of the contact hole 21 to remain.

Figure 24:
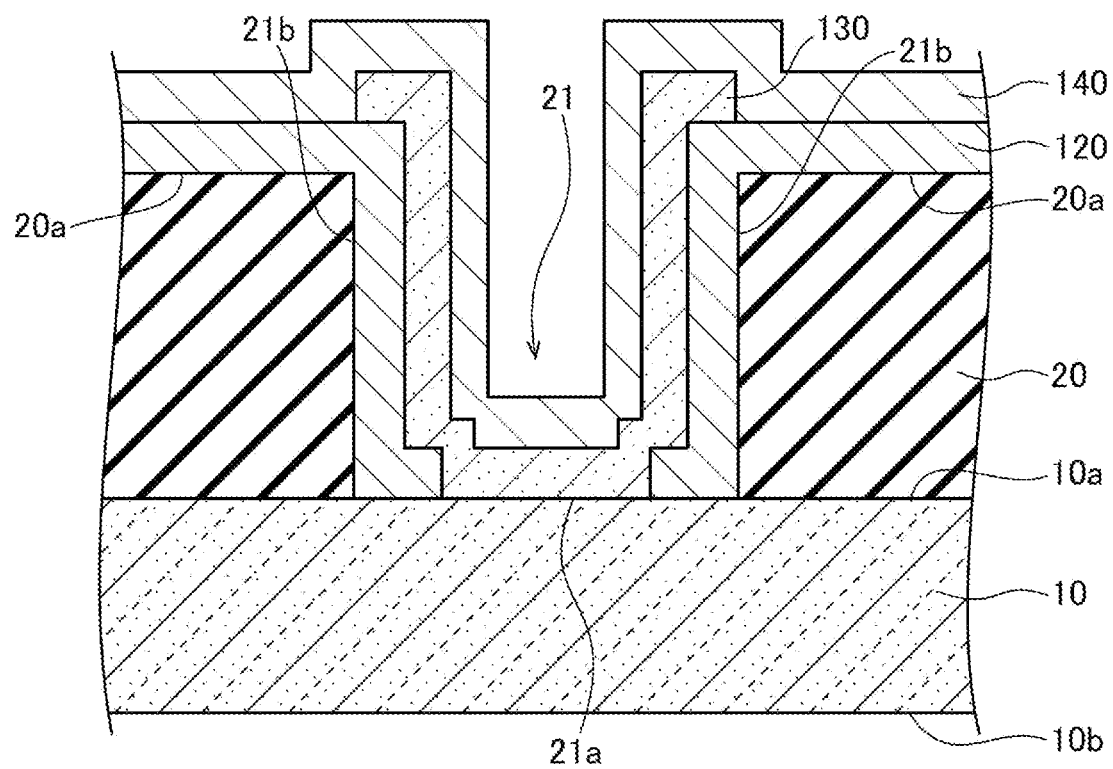
FIG. 24 is an explanatory diagram (4) of the method for producing the semiconductor device according to the second embodiment of the present disclosure.

Next, as illustrated in FIG. 24, the Ni film 140 is formed by sputtering on the TiN film 120 and the Si film 130.

Figure 25:
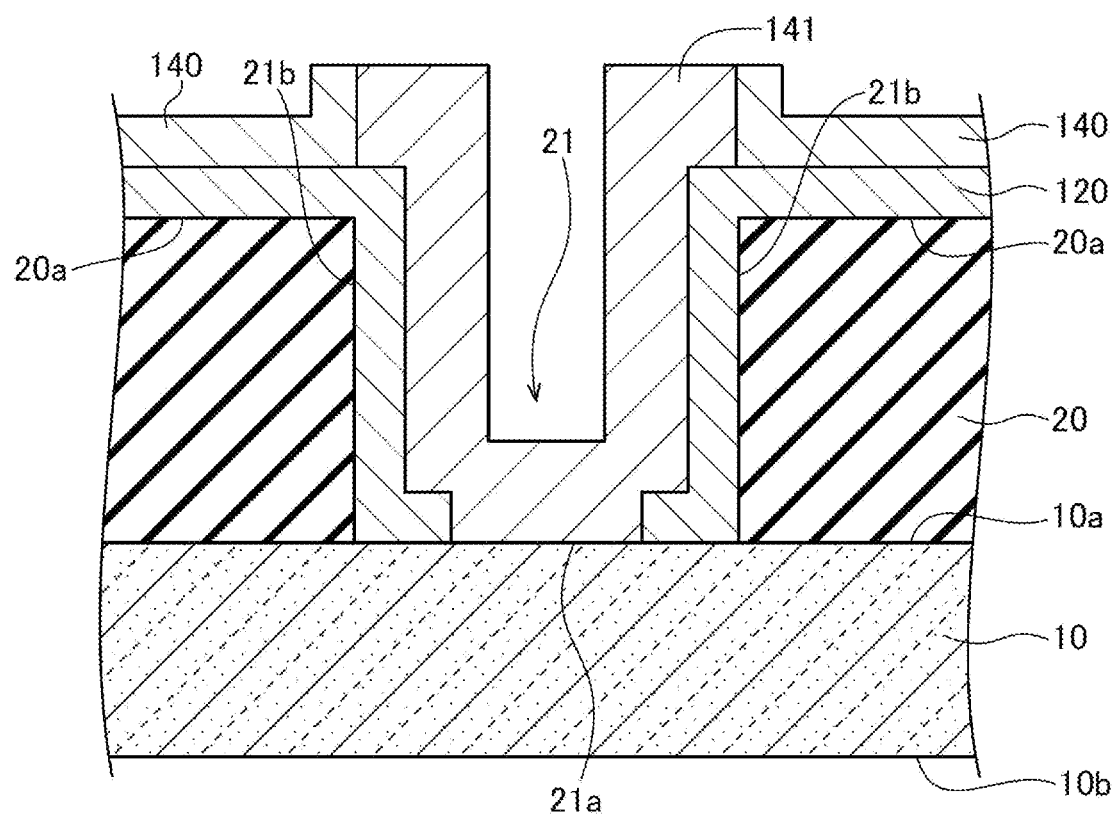
FIG. 25 is an explanatory diagram (5) of the method for producing the semiconductor device according to the second embodiment of the present disclosure.

Next, as illustrated in FIG. 25, the first heat treatment is performed at the temperature from 300° C. to 400° C., for example, about 350° C. This causes Si in the Si film 130 and Ni in the Ni film 140 on the Si film 130 to form the reaction precursor layer 141 of nickel silicide. Here, the Ni film 140 on the TiN film 120 does not silicidize.

Figure 26:
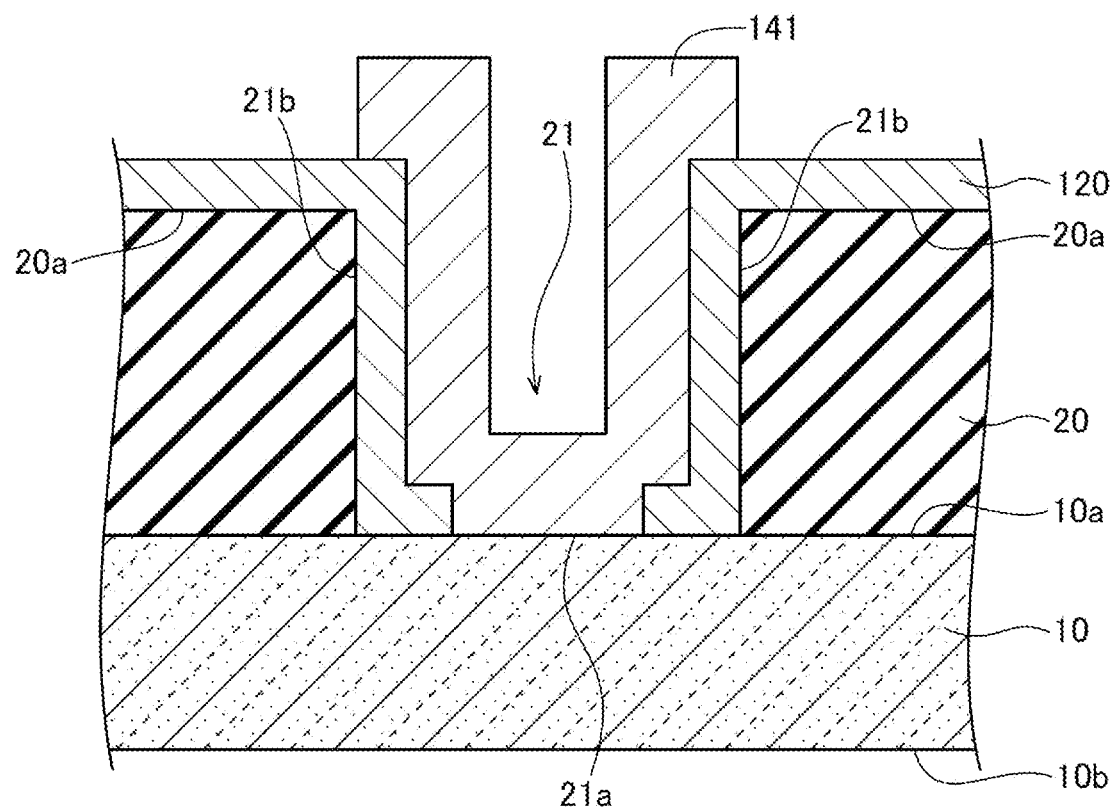
FIG. 26 is an explanatory diagram (6) of the method for producing the semiconductor device according to the second embodiment of the present disclosure.

Next, as illustrated in FIG. 26, the unreacted Ni film 140 is removed by wet etching. This causes the reaction precursor layer 141 to remain on the bottom surface 21a and side surfaces 21b of the contact hole 21.

Figure 27:
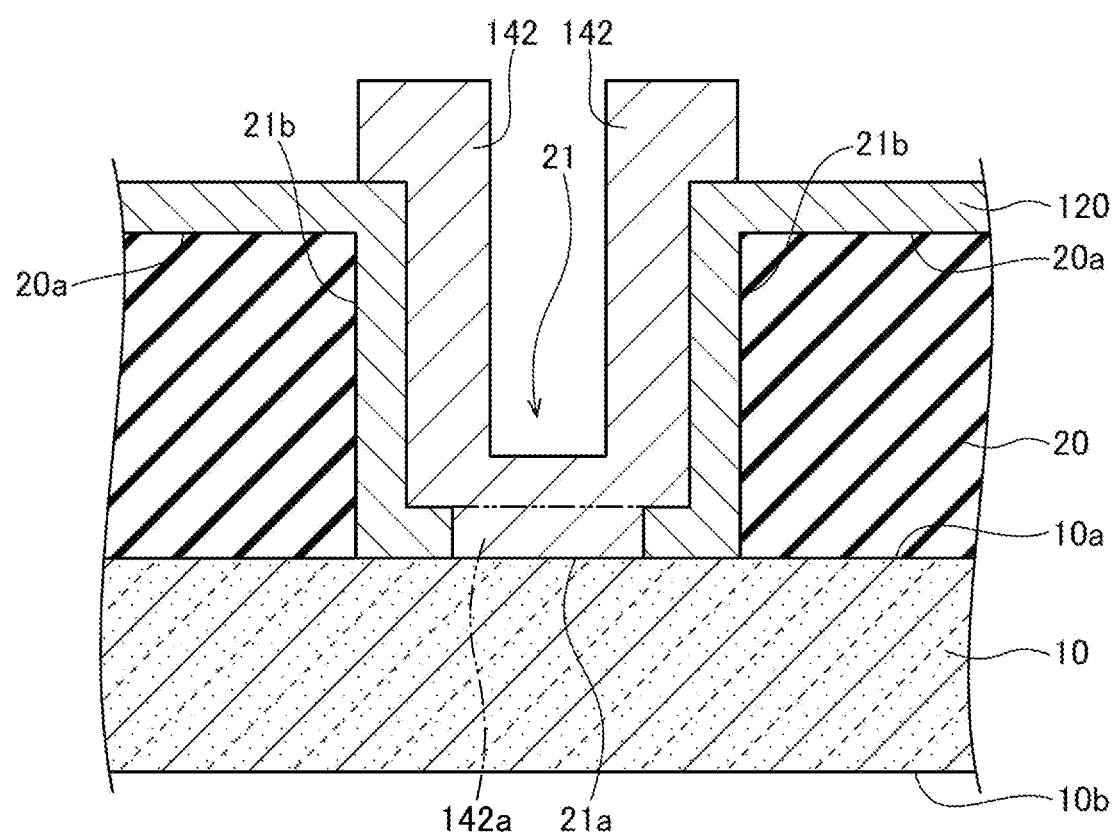
FIG. 27 is an explanatory diagram (7) of the method for producing the semiconductor device according to the second embodiment of the present disclosure.

Next, as illustrated in FIG. 27, by performing the second heat treatment at the temperature of about 1000° C., the reaction precursor layer 141 forms the electrode layer 142. The electrode layer 142 includes the ohmic region 142a in ohmic contact with the main surface 10a of the silicon carbide substrate 10. When forming the ohmic region 142a, almost no C is deposited on the surface of the electrode layer 142 because the amount of Si supplied from the silicon carbide substrate 10 is small. Thus, if a wiring layer such as Al is formed on the electrode layer 142, the wiring layer is not stripped from the surface of the electrode layer 142. Here, the wiring layer may be a film formed by sequentially laminating TiN and Al.

Modified Example

Figure 28:
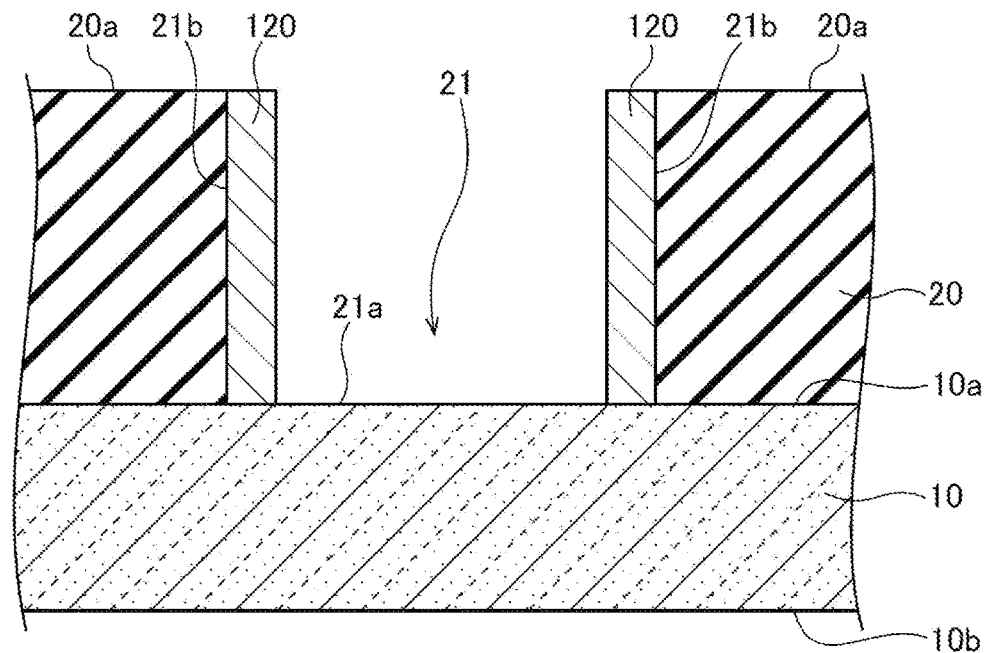
FIG. 28 is an explanatory diagram (1) of a method for producing a modified example of the semiconductor device of the second embodiment of the present disclosure.
Figure 29:
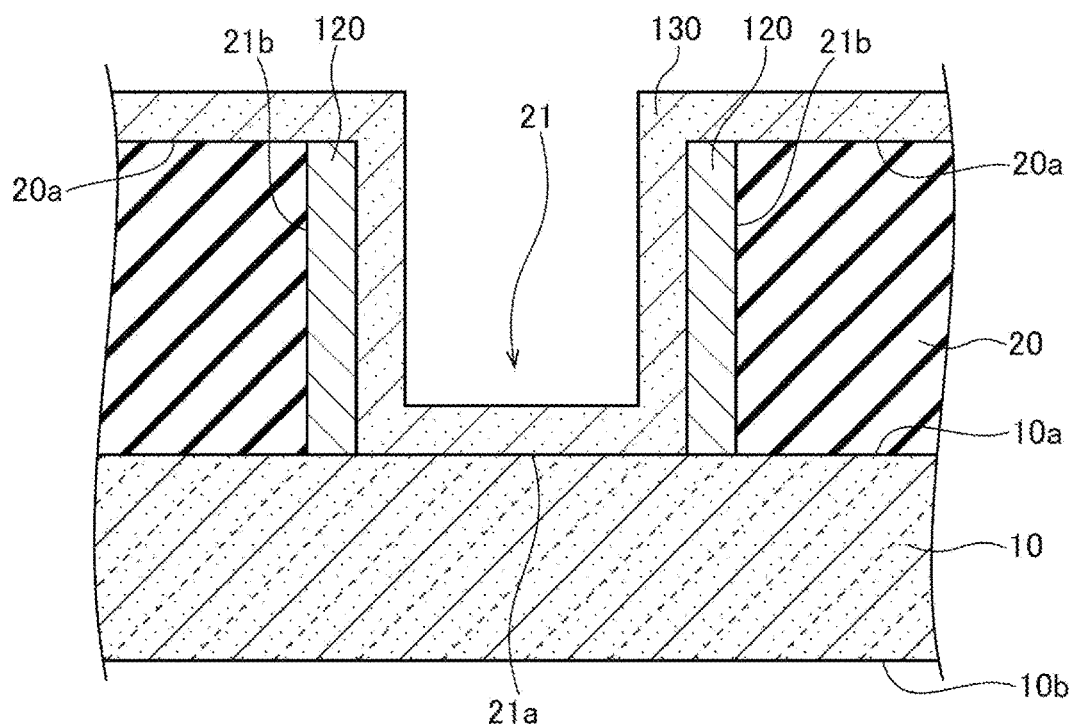
FIG. 29 is an explanatory diagram (2) of the method for producing a modified example of the semiconductor device of the second embodiment of the present disclosure.
Figure 30:
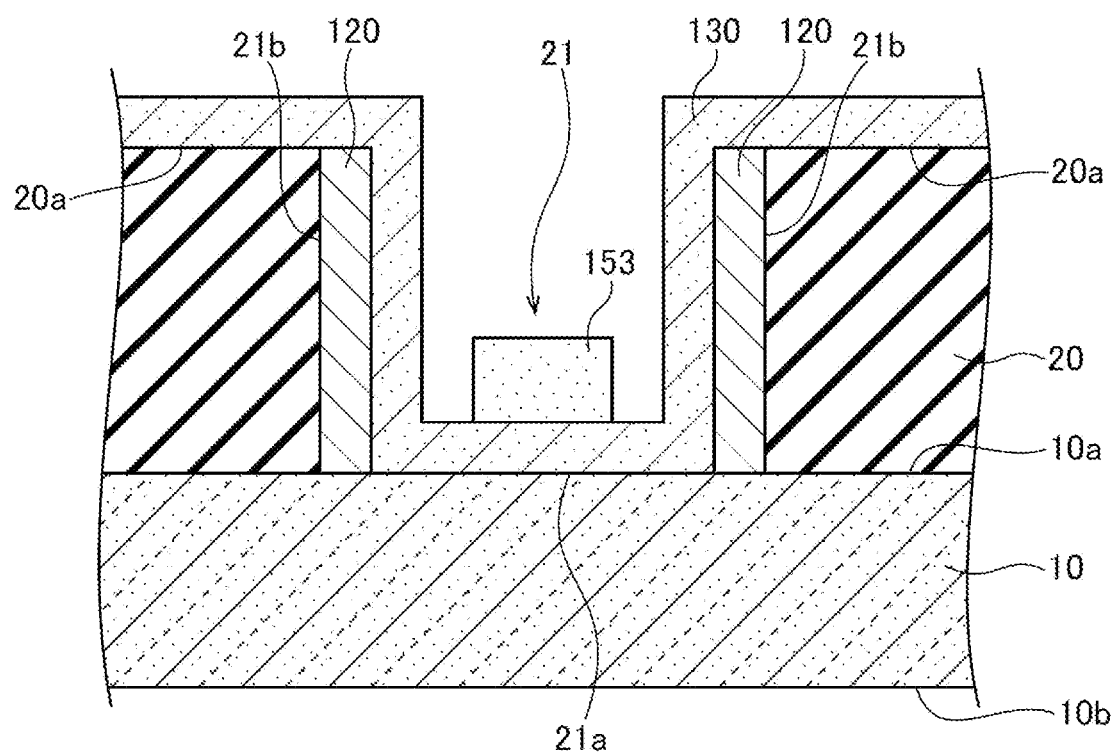
FIG. 30 is an explanatory diagram (3) of the method for producing a modified example of the semiconductor device of the second embodiment of the present disclosure.
Figure 31:
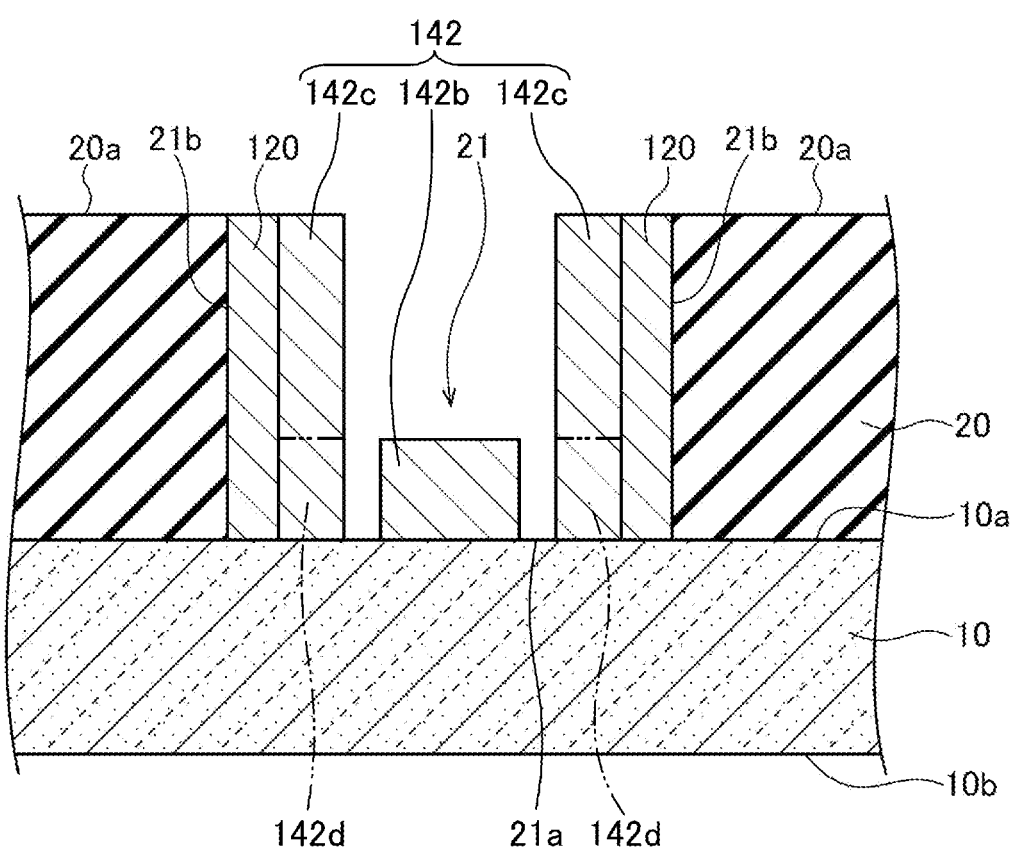
FIG. 31 is an explanatory diagram (4) of the method for producing a modified example of the semiconductor device of the second embodiment of the present disclosure.

In the present modified example, in the process illustrated in FIG. 21 above, as illustrated in FIG. 28, the TiN film 120 may alternatively be formed only on the side surfaces 21b of the contact hole 21. Subsequently, as illustrated in FIG. 29, the Si film 130 covering the TiN film 120, the bottom surface 21a of the contact hole 21, and the insulating film 20 is formed by sputtering. Subsequently, as illustrated in FIG. 30, a resist pattern 153 is formed on the Si film 130 in a region narrower than the bottom surface 21a of the contact hole 21 and the Si film 130 in a region where the resist pattern 153 is not formed is removed. Subsequently, as illustrated in FIG. 31, the first electrodes 142b and the second electrodes 142c are formed apart from one another at the bottom surface 21a of the contact hole 21 by performing substantially the same processes (steps S5 to S9) described above.

The contents other than the above are substantially the same as those of the first embodiment.

Although the embodiments have been described in detail above, the invention is not limited to the specific embodiment, and various variations and modifications may be made within the scope of the claims.

DESCRIPTION OF THE REFERENCE NUMERALS 10 silicon carbide substrate
10a one main surface
10b the other main surface
11 first n-layer
12 second n-layer
13 p-body layer
14 n-source region
18 p-region
20 insulating film
20a upper surface
21 contact hole
21a bottom surface
21b side surface
25 gate insulating film
30 TiN film
30a opening
40 Ni film
41 reaction precursor layer
41a ohmic electrode
70 wiring layer
71 gate electrode
72 drain electrode
120 TiN film
130 Si film
140 Ni film
141 reaction precursor layer
142 electrode layer
142a ohmic region
142b first electrode
142c second electrode
142d ohmic region
151, 152, 153 resist pattern

The invention claimed is:

1. A method for producing a silicon carbide semiconductor device, the method comprising:
preparing a silicon carbide substrate;
forming an insulating film on one main surface of the silicon carbide substrate;
forming a contact hole in the insulating film and exposing the one main surface of the silicon carbide substrate at a bottom surface of the contact hole;
forming an Si film on the bottom surface of the contact hole;
forming an Ni film on the Si film;
performing a first heat treatment at a first temperature at which Ni and Si react, after the forming of the Ni film;
removing an unreacted portion of the Ni film that does not react with the Si film, by wet etching after the first heat treatment; and
performing a second heat treatment at a second temperature higher than the first temperature after the removing of the unreacted portion.

2. The method as claimed in claim 1,
wherein the forming of the Si film on the bottom surface of the contact hole includes:
forming a first Si film on the bottom surface and side surfaces of the contact hole and on an upper surface of the insulating film; and
removing at least the first Si film on the upper surface of the insulating film by dry etching after the forming of the first Si film.

3. The method as claimed in claim 1,
wherein the first temperature is greater than or equal to 200° C. and less than or equal to 400° C.

4. The method as claimed in claim 1, wherein the second temperature is greater than or equal to 800° C. and less than or equal to 1100° C.

5. The method as claimed in claim 1, wherein a film thickness of the Si film at the bottom surface of the contact hole is greater than or equal to 5 nm and less than or equal to 100 nm.

6. The method as claimed in claim 1, wherein a film thickness of the Ni film at the bottom surface of the contact hole is greater than or equal to 5 nm and less than or equal to 100 nm.

7. The method as claimed in claim 1, wherein the Si film is also formed on side surfaces of the contact hole.

8. The method as claimed in claim 1, wherein a relationship of $N_{Ni} \geq N_{Si}/2$ is established when, at the bottom surface of the contact hole in a state in which the Ni film is formed on the Si film, a number of Si atoms contained in the Si film per unit area that is accumulated in a thickness direction is $N_{Si}$, and a number of Ni atoms contained in the Ni film per unit area that is accumulated in the thickness direction is $N_{Ni}$.

9. A silicon carbide semiconductor device comprising:
  a silicon carbide substrate having a main surface;
  an insulating film provided on the main surface of the silicon carbide substrate;
  a contact hole provided in the insulating film;
  a first electrode provided on a portion of a bottom surface of the contact hole, the first electrode being in contact with the silicon carbide substrate; and
  second electrodes provided on side surfaces of the contact hole, the second electrodes being provided apart from the first electrode,
  wherein the first electrode contains Si and Ni, and is in ohmic contact with the silicon carbide substrate, and
  wherein the first electrode is not in direct contact with the second electrodes.

10. The silicon carbide semiconductor device as claimed in claim 9, wherein a distance between the first electrode and each of the second electrodes at the bottom surface of the contact hole is greater than or equal to 0.1 μm and less than or equal to 1 μm.

11. The silicon carbide semiconductor device as claimed in claim 9, wherein the first electrode is arranged so as to be between the second electrodes with a gap therebetween.

\* \* \* \* \*